(12) United States Patent
Henley et al.

(10) Patent No.: US 9,257,339 B2
(45) Date of Patent: Feb. 9, 2016

(54) TECHNIQUES FOR FORMING OPTOELECTRONIC DEVICES

(71) Applicant: Silicon Genesis Corporation, San Jose, CA (US)

(72) Inventors: Francois J. Henley, Aptos, CA (US); Sien Kang, Dublin, CA (US); Albert Lamm, Suisun City, CA (US)

(73) Assignee: SILICON GENESIS CORPORATION, Santa Clara, CA (US)

(*) Notice: Subject to any disclaimer, the term of this patent is extended or adjusted under 35 U.S.C. 154(b) by 0 days.

(21) Appl. No.: 13/886,129

(22) Filed: May 2, 2013

(65) Prior Publication Data

US 2013/0292691 A1 Nov. 7, 2013

Related U.S. Application Data

(60) Provisional application No. 61/643,180, filed on May 4, 2012.

(51) Int. Cl.
| | |
|---|---|
| *H01L 21/78* | (2006.01) |
| *H01L 21/20* | (2006.01) |
| *H01L 29/20* | (2006.01) |
| *H01L 21/762* | (2006.01) |
| *H01L 21/02* | (2006.01) |

(Continued)

(52) U.S. Cl.
CPC .............. *H01L 21/78* (2013.01); *C30B 29/406* (2013.01); *C30B 33/06* (2013.01); *H01L 21/02005* (2013.01); *H01L 21/76254* (2013.01); *H01L 29/2003* (2013.01)

(58) Field of Classification Search
USPC .................................................. 438/459, 460
See application file for complete search history.

(56) References Cited

U.S. PATENT DOCUMENTS

| | | |
|---|---|---|
| 5,374,564 A | 12/1994 | Bruel |
| 6,013,563 A | 1/2000 | Henley et al. |
| 6,420,242 B1 | 7/2002 | Cheung et al. |

(Continued)

FOREIGN PATENT DOCUMENTS

| | | |
|---|---|---|
| EP | 1936678 A2 | 6/2008 |
| SU | 1282757 A1 | 12/1983 |

OTHER PUBLICATIONS

PCT International Search Report for international patent application PCT/US2013/039460 (Aug. 23, 2013).

(Continued)

*Primary Examiner* — Lex Malsawma

(57) ABSTRACT

Embodiments relate to use of a particle accelerator beam to form thin films of material from a bulk substrate are described. In particular embodiments, a bulk substrate having a top surface is exposed to a beam of accelerated particles. In certain embodiments, this bulk substrate may comprise GaN; in other embodiments this bulk substrate may comprise (111) single crystal silicon. Then, a thin film or wafer of material is separated from the bulk substrate by performing a controlled cleaving process along a cleave region formed by particles implanted from the beam. In certain embodiments this separated material is incorporated directly into an optoelectronic device, for example a GaN film cleaved from GaN bulk material. In some embodiments, this separated material may be employed as a template for further growth of semiconductor materials (e.g. GaN) that are useful for optoelectronic devices.

30 Claims, 21 Drawing Sheets

(51) Int. Cl.
*C30B 29/40* (2006.01)
*C30B 33/06* (2006.01)

(56) References Cited

U.S. PATENT DOCUMENTS

| | | |
|---|---|---|
| 7,390,724 B2 | 6/2008 | Henley et al. |
| 2007/0235074 A1 | 10/2007 | Henley et al. |
| 2008/0128641 A1 | 6/2008 | Henley et al. |
| 2008/0160661 A1 | 7/2008 | Henley et al. |
| 2008/0179547 A1 | 7/2008 | Henley et al. |
| 2008/0206962 A1 | 8/2008 | Henley et al. |
| 2009/0042369 A1 | 2/2009 | Henley et al. |
| 2009/0206275 A1 | 8/2009 | Henley et al. |
| 2010/0147448 A1 | 6/2010 | Agarwal et al. |
| 2010/0176371 A1* | 7/2010 | Lochtefeld ............ 257/13 |
| 2010/0178723 A1 | 7/2010 | Henley et al. |
| 2010/0282323 A1 | 11/2010 | Henley et al. |
| 2011/0111194 A1* | 5/2011 | Carre et al. ............ 428/215 |
| 2011/0156212 A1* | 6/2011 | Arena ............ 257/615 |
| 2012/0056510 A9 | 3/2012 | Chen et al. |
| 2012/0100691 A1* | 4/2012 | Faure ............ 438/458 |

OTHER PUBLICATIONS

Chu et al. "Plasma Immersion Ion Implantation—A Fledgling Technique for Semiconductor Processing," Materials Science and Engineering Reports: a Review Journal, pp. 207-280, vol. R17, Nos. 6-7, (Nov. 30, 1996).

Chu et al. "Recent Applications of Plasma Immersion Ion Implantation," Semiconductor International, pp. 165-172, Jun. 1996.

Gui et al. The effects of surface roughness on direct wafer bonding, Journal of Applied Physics 85:7448-7454 (May 1999).

Hayashi et al. "Chemical Mechanical Polishing of GaN," Journal of The Electrochemical Society, H113-H116 (2008).

Jothilingam et al., "A Study of Cracking in GaN Grown on Silicon by Molecular Beam Epitaxy," Journal of Electronic Materials, vol. 30, No. 7, pp. 821-824 (2001).

Weldon & al., "On the Mechanism of Hydrogen-Induced Exfoliation of Silicon", J. Vac. Sci. Technol., B 15(4), Jul./Aug. 1997.

* cited by examiner

TECHNIQUES FOR FORMING OPTOELECTRONIC DEVICES

CROSS-REFERENCE TO RELATED APPLICATIONS

The instant nonprovisional patent application claims priority to U.S. Provisional Patent Application No. 61/643,180 filed May 4, 2012, commonly owned and incorporated by reference in its entirety herein for all purposes.

BACKGROUND

Embodiments of the present invention relate generally to techniques including a method and a structure for forming substrates using a layer transfer technique. Certain embodiments employ an accelerator process for the manufacture of semiconductor films in a variety of applications including optoelectronic devices such as light emitting diodes (LEDs) and semiconductor lasers. But it will be recognized that the invention has a wider range of applicability; it can also be applied to other types of applications such as for three-dimensional packaging of integrated semiconductor devices, photonic or photovoltaic devices, piezoelectronic devices, flat panel displays, microelectromechanical systems ("MEMS"), nano-technology structures, sensors, actuators, integrated circuits, biological and biomedical devices, and the like.

Certain embodiments may including methods and apparatuses for cleaving free standing films from material in bulk form, such as a single crystal silicon ingot or a GaN ingot. Such free standing films are useful as a template for the formation of an optoelectronic device such as an LED. But, it will be recognized that embodiments of the invention have a wider range of applicability; it can also be applied to other types of applications such as for three-dimensional packaging of integrated semiconductor devices, photonic devices, piezoelectronic devices, flat panel displays, microelectromechanical systems ("MEMS"), nano-technology structures, sensors, actuators, integrated circuits, biological and biomedical devices, and the like.

Semiconducting materials find many uses, for example in the formation of logic devices, solar cells, and increasingly, illumination. One type of semiconductor device that can be used for illumination is the light emitting diode (LED). In contrast with traditional incandescent or even fluorescent lighting technology, LED's offer significant advantages in terms of reduced power consumption and reliability. Another type of semiconductor device that can be used for illumination is a laser. Lasers that operate based upon semiconductor principles are finding increasing adoption for use in displays and other applications.

Such optoelectronic devices rely upon materials exhibiting semiconductor properties such as silicon and also type III/V materials such as gallium nitride (GaN). Silicon is often made using either polysilicon (i.e. polycrystalline silicon) and/or single crystal silicon materials. GaN is also available in various degrees of crystalline order. However, these materials are often difficult to manufacture.

Additionally, both silicon and other semiconducting materials suffer from material losses during conventional manufacturing called "kerf loss", where the sawing process eliminates as much as 40% and even up to 60% of the starting material from a cast or grown boule and singulate the material into a wafer form factor. This is a highly inefficient method of preparing expensive semiconducting materials for optoelectronic applications.

In particular, conventional techniques for manufacturing single crystal silicon or other semiconductor materials into electronic devices, typically involve the physical separation of thin single crystal silicon layers or layers of other semiconductor materials, from an originally grown ingot or boule. One such a conventional manufacturing technique is inner diameter (ID) sawing.

The ID sawing technique employs a circular saw having a blade located on its inner diameter. The ingot is pushed through the center of the saw until a desired wafer thickness is on the other side of the saw. With the saw rotating, the saw is then raised or lowered to allow the blade to slice through the ingot. The ID sawing method offers a number of possible disadvantages.

One is that the saw must be of minimum thickness to be sufficiently strong to withstand the stress of the sawing action. However, an amount of silicon material corresponding to this saw thickness (the kerf) is lost by this cutting. Use of even the thinnest saw blade that can reliably be used to saw the ingot, may result in losses of expensive, pure single crystal silicon to the kerf. For example, a typical saw blade kerf has a width of 300 μm, where an individual sliced wafer may have a width of only 800 μm. Use of the conventional wafer sawing technique can thus result in kerf losses of expensive, pure starting material amounting to as high as 60% of the entire ingot. Another disadvantage of the conventional ID sawing technique is that slices can only be separated one at a time, thus limiting throughput and elevating cost.

Partly in response to the limited throughput of sawing, the alternative conventional technique of wire sawing has been developed. In wire sawing, a network of rapidly moving parallel wires is provided. The side of an ingot is then contacted with the moving wires in an environment including oil and abrasives, resulting in simultaneous slicing of the wafer into a plurality of wafers. The advantages of this technique over ID sawing includes parallel sawing of the boule and producing thinner wafers of 180-250 um with a more modest 190-250 um kerf loss. While effective, conventional wire sawing also offers disadvantages, in particular a still significant kerf loss of about 50% attributable to the thickness of the wire, and possible contamination by exposure of the substrate to the oil and abrasives.

From the above, it is seen that techniques for forming suitable substrate materials of high quality and low cost are highly desired. Cost-effective and efficient techniques for the manufacture of semiconductor-based optoelectronic devices are also desirable.

SUMMARY

Embodiments relate to use of a particle accelerator beam to form thin films of material from a bulk substrate. In particular embodiments, a bulk substrate (e.g. donor substrate) having a top surface is exposed to a beam of accelerated particles. In certain embodiments, this bulk substrate may comprise GaN; in other embodiments this bulk substrate may comprise (111) single crystal silicon. Then, a thin film or wafer of material is separated from the bulk substrate by performing a controlled cleaving process along a cleave region formed by particles implanted from the beam. In certain embodiments this separated material is incorporated directly into an optoelectronic device, for example a GaN film cleaved from GaN bulk material. In some embodiments, this separated material may be employed as a template for further growth of semiconductor materials (e.g. GaN) that are useful for optoelectronic devices.

Some embodiments of the present invention provides a method that includes providing a workpiece bearing a layer of additional material, introducing a plurality of particles through the additional material to form a cleave region in the workpiece, and applying energy to cleave a detached thickness of workpiece material including the layer of additional material from a remainder of the workpiece. The method also includes processing the layer of additional material and bonding the layer of additional material to a substrate having a coefficient of thermal expansion approximately equal to a coefficient of thermal expansion of the layer of additional material.

In another embodiment of the method, the layer of additional material is formed on top of the workpiece at a temperature.

In another embodiment, mismatch between the layer of additional material and the workpiece material develops a level of stress lower than a threshold value sufficient to nucleate and propagate defects within the layer of additional material.

In another embodiment, processing the additional layer of material comprises relaxing a level of stress in the additional layer of material.

In another embodiment, relaxing the level of stress comprises removing workpiece material.

In another embodiment, the removing workpiece material comprises etching.

In another embodiment, relaxing the level of stress comprises bonding the additional layer of material to a strain relaxation substrate (SRS), and then changing a property of the SRS.

In another embodiment, the SRS comprises a piezoelectric material, and changing the property comprises changing a dimension of the piezoelectric material.

In another embodiment, the SRS comprises a surface bound to the additional material, and changing the property comprises changing the surface from solidus to liquidus.

In another embodiment, providing the workpiece comprises providing a single crystal silicon workpiece bearing GaN as the layer of additional material.

In another embodiment, providing the single crystal silicon workpiece comprises providing a (111) single crystal silicon workpiece.

In another embodiment, the additional layer of GaN comprises a layer of thickness between about 0.1-1 um formed by a low temperature epitaxial growth process at a temperature of between about 700-900° C.

In another embodiment, the additional layer of GaN comprises a layer having a thickness at or below a critical thickness indicated in FIG. 1 of Jothilingam et al., "A Study of Cracking in GaN Grown on Silicon by Molecular Beam Epitaxy", Journal of Electronic Materials, Vol. 30, No. 7, pp. 821-824 (2001).

In another embodiment, wherein the bonding comprises releasable bonding between the additional layer of material and the substrate.

In another embodiment, the releasable bonding is based upon surface roughness of the additional layer of material and/or surface roughness of the substrate.

In another embodiment, the detached thickness of workpiece material is between about 10-100 um.

In another embodiment, providing the workpiece comprises providing a silicon or sapphire workpiece bearing GaN as the layer of additional material.

Some embodiments of the present invention provide a workpiece for formation of an optoelectronic device, the workpiece includes a layer of crystalline material having a lattice constant compatible with formation of an overlying film of semiconductor material, and a substrate bonded to a first surface of the layer of crystalline material opposite to a second surface of the layer of material upon which the overlying film of semiconductor material is to be formed, the substrate having a coefficient of thermal expansion approximately equal to a coefficient of thermal expansion of the layer of crystalline material.

In another embodiment of the workpiece, the layer of crystalline material exhibits a level of stress lower than a threshold value sufficient to nucleate and propagate defects within the crystalline material.

In another embodiment, mismatch between the substrate and the layer of crystalline material develops the level of stress insufficient to generate more than about $1 \times 10^4$ defects/cm$^2$.

In another embodiment, mismatch between the substrate and the layer of crystalline material develops the level of stress insufficient to generate more than $1 \times 10^6$ defects/cm$^2$.

In another embodiment, the layer of crystalline material comprises a non-thermal stress relaxed material.

In another embodiment, the layer of crystalline material comprises GaN and the substrate comprises metal.

In another embodiment, a coefficient of thermal expansion of the metal substrate is approximately equal to a coefficient of thermal expansion of the GaN at a temperature range of between about 900-1200° C.

In another embodiment, the substrate is releasably bonded to the layer of crystalline material based upon a roughness of the substrate and/or a roughness of the layer of material.

In another embodiment, the substrate is releasably bonded to the layer of crystalline material based upon an intervening sacrificial layer.

In another embodiment, the intervening sacrificial layer comprises an oxide.

Some embodiments of the present invention provide a method that includes providing a workpiece bearing a layer of additional material at an interface, directing a plurality of accelerated particles at the additional material to form a cleave region at or near the interface, and applying energy to cleave a detached thickness of workpiece material including the layer of additional material, from a remainder of the workpiece. The method also includes processing the layer of additional material; and bonding the layer of additional material to a substrate having a coefficient of thermal expansion approximately equal to a coefficient of thermal expansion of the layer of additional material.

In another embodiment, the layer of additional material is formed on top of the workpiece at a temperature.

In another embodiment, mismatch between the layer of additional material and the workpiece material, develops a level of stress lower than a threshold value sufficient to nucleate and propagate defects within the layer of additional material.

In another embodiment, processing the additional layer of material comprises relaxing a level of stress in the additional layer of material.

In another embodiment, relaxing the level of stress comprises removing workpiece material.

In another embodiment, the removing workpiece material comprises etching.

In another embodiment, wherein relaxing the level of stress comprises bonding the additional layer of material to a strain relaxation substrate (SRS), and then changing a property of the SRS.

In another embodiment, the SRS comprises a piezoelectric material, and changing the property comprises changing a dimension of the piezoelectric material.

In another embodiment, the SRS comprises a surface bound to the additional material, and changing the property comprises changing the surface from solidus to liquidus.

In another embodiment, providing the workpiece comprises providing a single crystal silicon workpiece bearing GaN as the layer of additional material.

In another embodiment, providing the single crystal silicon workpiece comprises providing a (111) single crystal silicon workpiece.

In another embodiment, the additional layer of GaN comprises a layer of thickness between about 0.1-1 um formed by a low-temperature epitaxial growth process at a temperature of between about 700-900° C.

In another embodiment, the additional layer of GaN comprises a layer having a thickness at or below a critical thickness indicated in FIG. 1 of Jothilingam et al., "A Study of Cracking in GaN Grown on Silicon by Molecular Beam Epitaxy", Journal of Electronic Materials, Vol. 30, No. 7, pp. 821-824 (2001).

In another embodiment, the bonding comprises releasable bonding between the additional layer of material and the substrate.

In another embodiment, the releasable bonding is based upon surface roughness of the additional layer of material and/or surface roughness of the substrate.

In another embodiment, the detached thickness of workpiece material is between about 10-100 um.

In another embodiment, providing the workpiece comprises providing a silicon or sapphire workpiece bearing GaN as the layer of additional material.

A further understanding of the nature and advantages of the present invention may be realized by reference to the remaining portions of the specification and the drawings.

DETAILED DESCRIPTION

Figure 1:
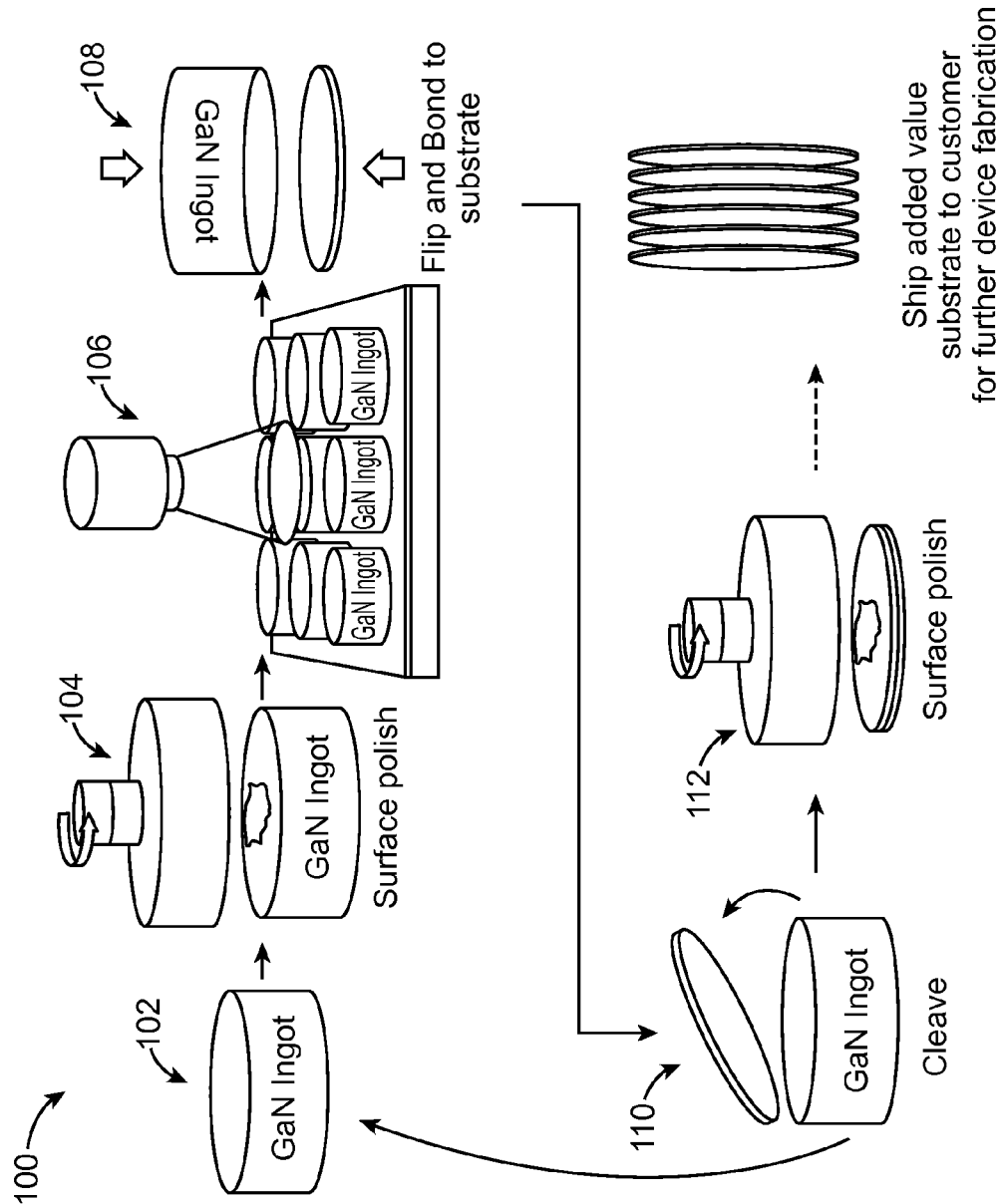
FIG. 1 is a simplified process flow illustrating a method using a layer transfer process according to an embodiment of the present invention.

According to embodiments of the present invention, techniques including a method for forming substrates are provided. More particularly, embodiments according to the present invention provide a method to form a layer of material from a semiconductor material. In a specific embodiment, the layer of material is provided using a plurality of high energy particles to cause a formation of a cleave plane in the semiconductor substrate. Methods according to embodiments of the invention can be used in a variety of applications, including but not limited to optoelectronic devices, semiconductor device packaging, photovoltaic cells, MEMS devices, and others.

According to certain embodiments of the present invention, a free standing film may be separated from a bulk material. In one embodiment, a free standing layer of semiconductor material such as single crystal silicon, having a thickness of 10 μm or greater, may be cleaved from a bulk ingot utilizing high energy implantation. Cleaving the ingot in this manner substantially reduces the amount of semiconductor material that is otherwise lost to the kerf in a conventional blade cutting process. In addition to enhancing the efficiency of the cleave action, managing parameters such as ion dose and temperature profile is also important to limit and control the radiation damage to the material that is separated. The resulting cleaved free standing film may be particularly suited for use in illumination, for example LEDs or laser devices.

For purposes of the following disclosure, a "free standing film" or "free standing layer" is defined as a film of material that can maintain its structural integrity (i.e. not crumble or break apart), without being in contact with a supporting member such as a handle or transfer substrate. Typically, very thin films (for example silicon films thinner than about 5-10 μm) are unable to be handled without breaking. Conventionally, such thin films are manipulated using a supporting structure, which may also be needed to create the thin film in the first place. Handling of thicker films (i.e. silicon films having a thickness of between 10-50 μm) may be facilitated by the use of a support, but such a support is not mandatory. Accordingly embodiments of the present invention relate the fabrication of free standing films of silicon having a thickness of greater than 10 μm. Also for purposes of the following disclosure, the terms "substrate" and "tile" are employed interchangeably.

Embodiments in accordance with the present invention are not limited to forming free standing films. Alternative embodiments may involve the formation of films supported by a substrate. Moreover, irrespective of whether the films used in various applications are truly free-standing or supported with handling or transfer substrates during processing, processed cells are usually mounted onto a mechanical surface such as glass or plastic for the final application as an integral part of a lighting module.

Also for purposes of the following disclosure, "bulk material" refers to a material present in bulk form. Examples of such bulk material include a substantially circular ingot or boule of single crystal silicon as grown, or a grown single crystal silicon ingot having sides shaved to exhibit other than a substantially circular cross-sectional profile. Other examples of bulk materials include polycrystalline silicon plates or substrates exhibiting a square, rectangular, or trapezoidal profile. Still other examples of bulk materials are described below.

In a specific embodiment, the present method may be applied successively to cleave multiple slices of free standing layers from a single ingot, e.g., silicon boule. That is, the method can be repeated to successively cleave slices (similar to cutting slices of bread from a baked loaf) according to a specific embodiment. Of course, there can be other variations, modifications, and alternatives.

FIG. 1 shows one example of a process flow 100 according to an embodiment. In a first step 102 of this a process flow, a donor substrate comprising GaN in bulk form as an ingot, is provided. While in this particular embodiment the donor substrate comprises GaN, this is not required. A donor substrate according to various embodiments could be a silicon wafer, a germanium wafer, silicon germanium materials, silicon carbide bearing materials, Group III/V compounds, any combination of these, and others.

In an optional step 104, the surface of the GaN ingot may be polished, for example when the ingot has been reused from a previous layer transfer process. In a step 106, the GaN ingot is subjected to implantation with accelerated particles, to form a cleave region. In certain embodiments, this cleave region may lie at a depth of between about 10-20 um underneath the surface of the bulk material. Formation of a cleave region depends upon such factors as the target material, the crystal orientation of the target material, the nature of the implanted particle(s), the dose, energy, and temperature of implantation, and the direction of implantation. Such implantation is discussed further in detail below, and may share one or more characteristics described in detail in connection with the following patent applications, all of which are incorporated by reference in their entireties herein: U.S. patent application Ser. Nos. 12/789,361; 12/730,113; 11/935,197; 11/936,582; 12/019,886; 12/244,687; 11/685,686; 11/784,524; 11/852,088.

In an optional next step 108, the surface of the implanted bulk material is bonded to a substrate, which may be a handle substrate. This bonding may be temporary in nature, or may be more permanent. The bonding may employ techniques including but not limited to electrostatic bonding, plasma bonding, bonding based upon interatomic forces arising from surface roughness, adhesives, or others.

Releasable bonding may be accomplished utilizing one or more various techniques, in combination. One such technique is the use of a thin intervening layer (for example silicon oxide), that is later sacrificed to effect separation. Releasable bonding may also be achieved based upon certain roughness regimes, for example as disclosed by Cui et al. in "The Effect of Surface Roughness on Direct Wafer Bonding", Journal of Applied Physics, Vol. 85, No. 10, pp. 7448-7454 (1999), which is incorporated by reference in its entirety herein for all purposes.

The handle substrate can be glass, quartz, polymeric, metal or metal alloy, or other composites, and the like. In other embodiments, the handle substrate can be any homogeneous, graded, or multilayered material, or any combination of these. That is, the handle substrate can be made of almost any monocrystalline, polycrystalline, or even amorphous type substrate. The substrate can be made of SiC. Additionally, the substrate can be made of III/V materials such as gallium arsenide, gallium nitride (GaN), and others. Additionally, the handle substrate can be metal or metal alloy, silicon carbide, germanium, silicon, glass or quartz combinations, plastics, and polymers.

A backing substrate may be provided to add rigidity to handle substrate structure. Preferably, the backing substrate has a thickness and material that is adequate to provide an effective deflection characteristic of a multilayered structure composed of at least the backing substrate and handle substrates to be suitable for a thickness of silicon bearing material from the donor substrate to be transferred onto the face of the handle substrate. As merely an example, the backing substrate can be a silicon wafer for a quartz handle substrate. Other types of materials and certain thicknesses such as plastic, metal, glass, quartz, composites, and the like can be used to provide the rigidity to the combined backing and handle substrate structures. Of course, one of ordinary skill in the art would recognize other variations, modifications, and alternatives.

In a next step 110, thickness of material of the implanted surface of the bulk material, is cleaved from the bulk material using the cleave region. In certain embodiments, this produces a detached layer of semiconductor material having a thickness of between about 10-20 um.

The cleaving may take place utilizing the application of various forms of energy, and may exhibit one or more of the characteristics disclosed in any of the patent applications incorporated by reference above. In a particular embodiment, this cleaving may take place utilizing a compressional force applied in the form of a static gas in a high pressure chamber containing the implanted bulk material. Ser. No. 13/225,172, filed Sep. 2, 2011, The application of energy in various forms to accomplish cleaving according to particular embodiments is also described in the U.S. Pat. No. 6,013,563 incorporated by reference herein for all purposes.

As described in connection with the following figures, and in further detail below, a cleaving process may itself comprise one or more steps. FIGS. 1A-D show simplified views of a controlled cleaving process according to certain embodiments.

Figure 1A:
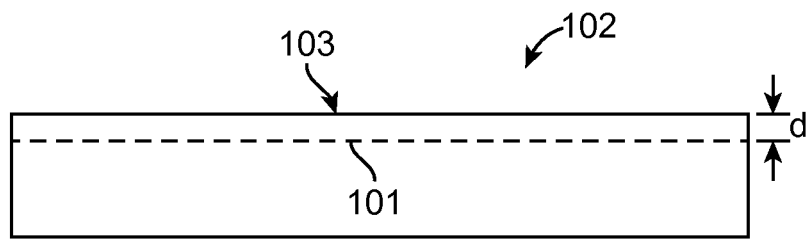
FIGS. 1A-D show steps of controlled cleaving according to various embodiments.

FIG. 1A shows the implanted bulk material 102 prior to cleaving, which in a particular embodiment may be GaN. The cleave region 101 lies at a depth d below the surface 103.

Figure 1B:
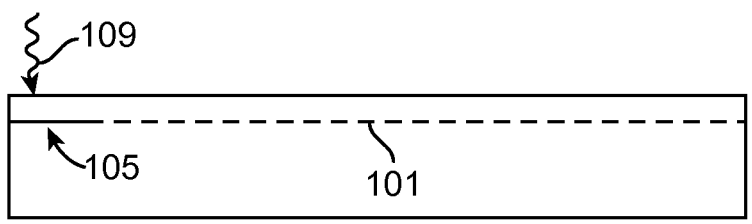

FIG. 1B shows a first cleaving step, wherein application of energy to a cleave initiation region 105, results in the initiation of cleaving. An example of such a cleave initiation step is the application of energy in the form of a photon beam 109, for example from a laser. This delivered energy causes initiation of cleaving as shown.

Figure 1C:
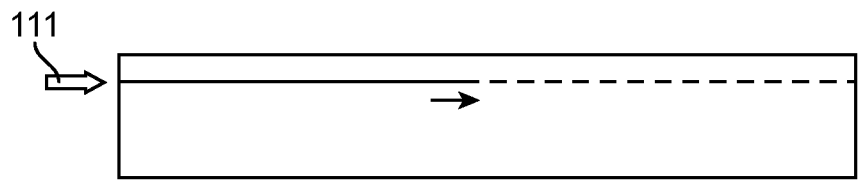

FIG. 1C shows a second cleaving step, wherein application of additional energy 111 results in propagation of the cleaving in the cleave region. Continued propagation of the cleaving frees a thickness of material from the bulk material.

Figure 1D:
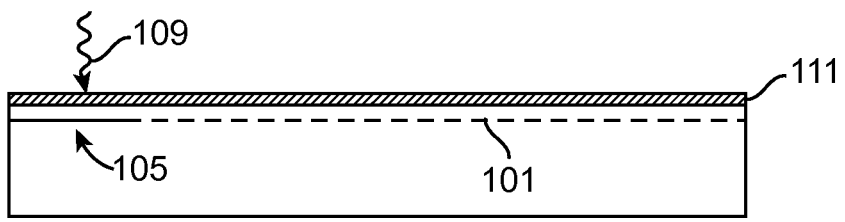

It is noted that in certain applications, the bulk material may exhibit substantial transparency to the transmission of optical energy. Thus in order to deliver energy to the cleave initiation region from an incident optical beam, as shown in FIG. 1D a thin overlying layer 113 that absorbs the incident photons, may be provided. Absorption by this layer 113 will create heat, that in turn is transmitted through the bulk material to the cleave initiation region. This light absorbing material can be any material, and in certain embodiments may comprise SiC. In some embodiments, the light absorbing material could be removed once the desired cleave initiation has occurred. In certain embodiments, the light absorbing material can be retained during one or more additional processing steps described below.

While the above has described application of energy in the form of an incident optical beam to accomplish cleaving, this is not necessarily required. Alternative embodiments could apply other forms of energy for cleaving purposes, including but not limited to global or local heating of the substrate, in whole or in part from heat lamps, electron beams, or even thermal energy associated with implantation of particles.

Returning to FIG. 1, in a next step 112 of the process, the exposed surface of the cleaved material on the substrate, is polished to reduce roughness resulting from any cleaving process. The combination of the polished cleaved material and the underlying substrate may then be transferred as an added value material for further processing and incorporation into an optoelectronic device.

The above sequence of steps provide a method according to certain embodiments of the present invention. Other alternatives can also be provided where steps may be added, one or more steps may be removed, or one or more steps may be provided in a different sequence. For example in an alternative embodiment, substrate bonding could take place after the cleaving, with the cleaving resulting in a free standing film in turn bonded to the substrate.

Figure 2:
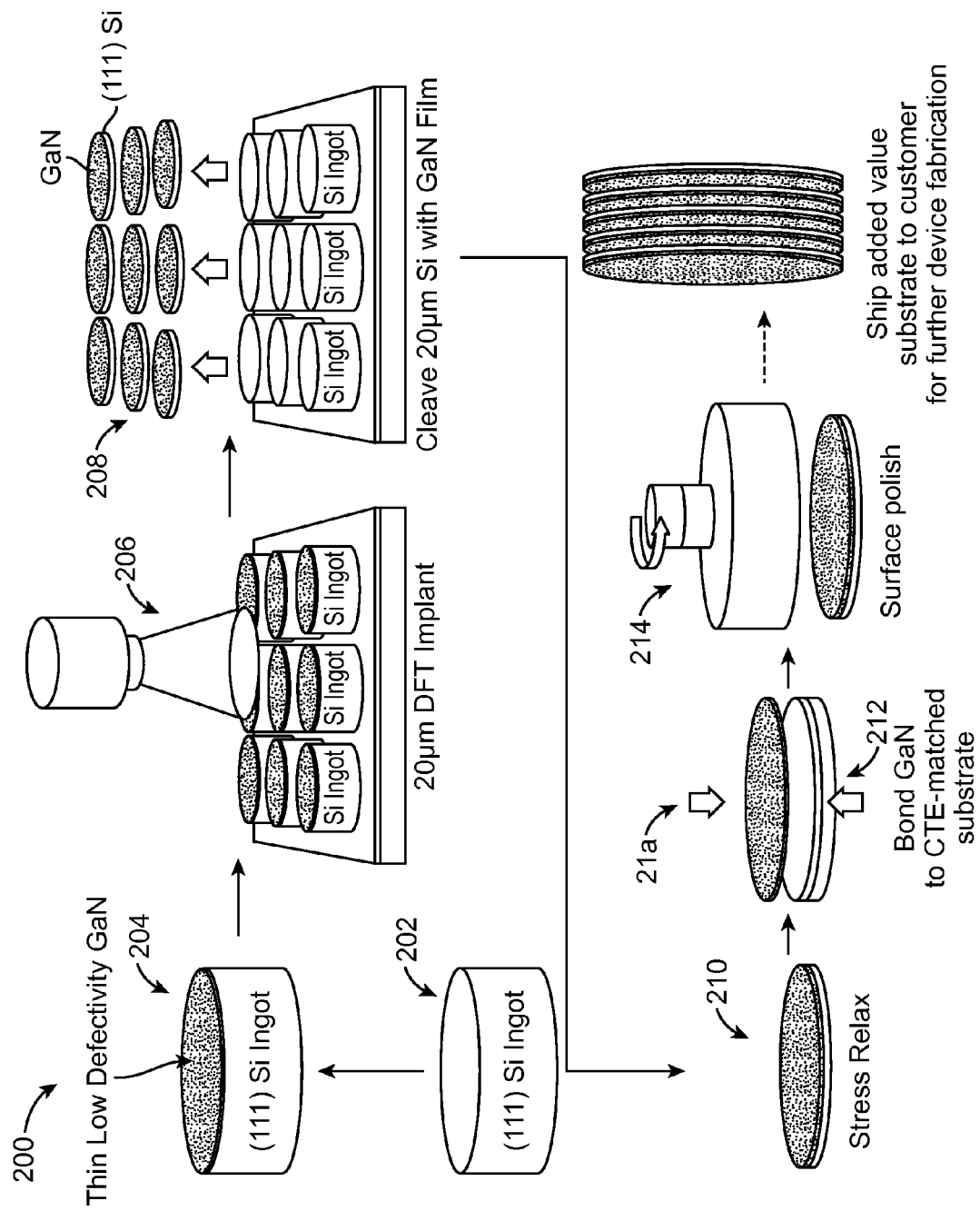
FIG. 2 is a simplified process flow illustrating an alternative embodiment.

And while the embodiment of FIG. 1 shows cleaving of a uniform bulk material (here GaN), this is not required and other embodiments could involve cleaving of multi-layer substrates that include bulk material. For example, FIG. 2 shows an example of a process flow 200 according to another embodiment. In a first step 202 of this a process flow, a single crystal silicon in bulk form as a Si ingot, is provided. This ingot may exhibit one of the typical crystalline orientations of single crystal silicon, for example (111).

In a next step 204, an additional layer of material is formed on top of the bulk material. In particular embodiments, this additional layer may comprise a thin layer of GaN. As described by Jothilingam et al., "A Study of Cracking in GaN Grown on Silicon by Molecular Beam Epitaxy", Journal of Electronic Materials, Vol. 30, No. 7, pp. 821-824 (2001) (incorporated by reference herein for all purposes), thin GaN films with low defects may be formed over single crystal silicon substrates having a (111) orientation. In that particular reference, a radio frequency (RF) plasma source was used to activate an AlN buffer layer. The GaN films were grown at temperatures between 720-835° C., with growth rates in the range of 0.2-0.55 μm/hr. GaN films having a thickness of 1 um or less were observed to not exhibit cracking under particular substrate temperature conditions.

Figure 2A:
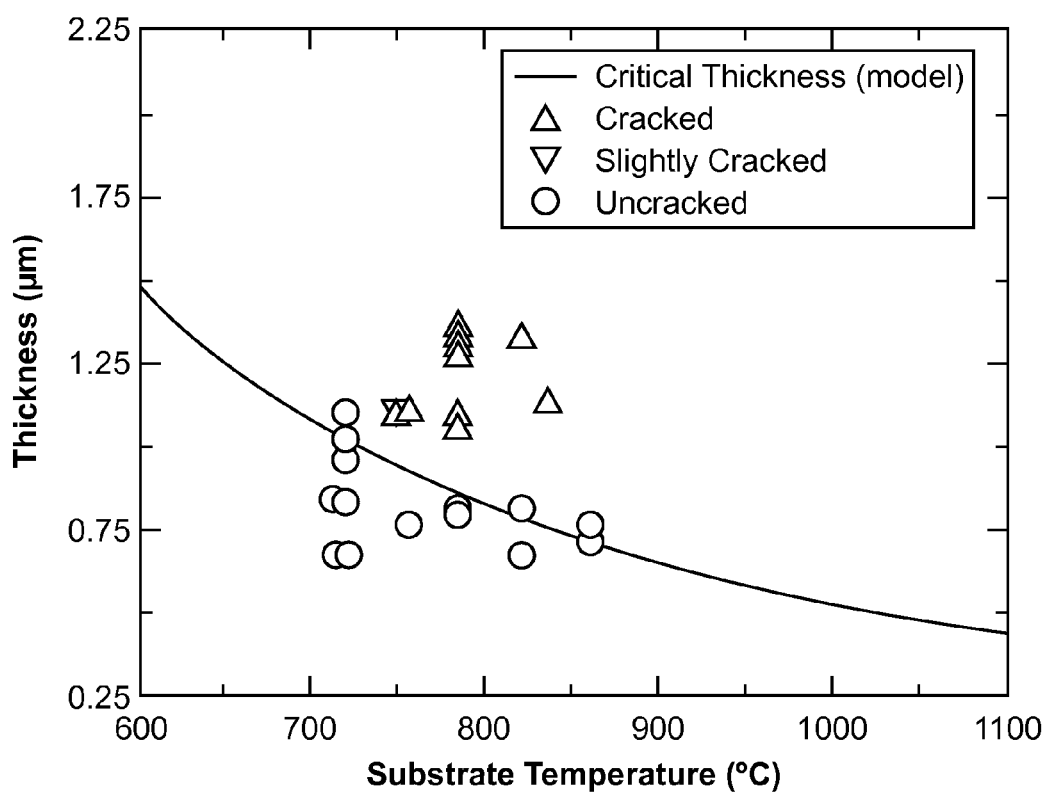
FIG. 2A plots the onset of dislocations as a function of GaN thickness and substrate temperature.

FIG. 2A is taken from the Jothlingam paper plots GaN thickness versus substrate temperature, showing values for a "critical thickness" below which the film at the specific growth temperature will not relax by generating cracks and dislocations. Generally, non-dislocated thin films can be grown at lower temperature without substantial defects, by limiting the energy necessary to strain relax the film, and keeping the total thickness less than a specific critical thickness. The strain relaxation processes include thermally activated nucleation and propagation of cracks and dislocations. Although of higher quality and limited defect density, such films may be of limited value in opto-electronic devices owing to built-in stresses that cannot sustain any further growth without dislocating. Such stresses may play a role in causing dislocations at higher temperatures used in industrial LED processes, for example. In order to reduce or eliminate the generation of defects in certain embodiments, non-thermal strain relaxation as described below (for example in step 210) can be employed.

Certain embodiments may form the additional film of material, to serve as a template for the formation of the actual thicknesses of additional material needed for optoelectronic devices. For example, this additional film of material may comprise a lattice structure compatible with formation of an overlying film of semiconductor material. For example, the high quality of the thin GaN layer formed at lower growth temperature by MBE in the Jothilingam paper is suited for the formation of additional GaN utilizing faster-operating processes if an intervening step of non-thermal strain relaxation is used in step 210 according to certain embodiments as is discussed further below.

In a step 206, the surface of the workpiece bearing the additional material is subjected to implantation with accelerated particles, to form a cleave region. In certain embodiments, this cleave region may lie at a depth of between about 10-20 um underneath the additional material. Again, the particular characteristics of the implantation are determined by at least the factors indicated above, and further includes the identity, thickness, and crystalline orientation of the additional material. The implantation may share characteristics with one or more of the various incorporated patent applications.

In a next step 208, a thickness of the bulk material overlying the cleave region, including the additional material, is detached from the remaining bulk material to form a free standing layer. This cleaving may take place according to one or more characteristics as described herein and in the incorporated patent applications.

In a next step 210, the free standing layer of material may be modified according to a non-thermal strain relaxation step. Specifically, in particular embodiments the detached thickness of the bulk material may be removed in order to accommodate stress/strain relief in the additional material.

For example, GaN grown by molecular beam epitaxy over (111) single crystal silicon can become stressed as a result of mismatch between lattice spacing of the single crystal silicon and the additional GaN material. In particular, while silicon exhibits a lattice spacing of 5.431 angstroms, the additional overlying GaN material has an unstrained c-plane lattice spacing of 5.19 angstroms. As a result, the GaN layer will grow in a stressed state until its strain energy exceeds a yield point, after which the film will undergo a stress relaxation through the generation of defects and dislocations. Moreover, additional stresses can be generated due to the CTE mismatch between the layer of material and the base substrate material. In this example, since the CTE of the GaN layer is about twice that of silicon, cooling of the grown GaN film on silicon will generate additional stresses that can contribute to defect generation.

The magnitude of the stress experienced by the additional layer may be a function of factors such as the layer thickness, growth conditions, and/or degree of relaxation of the film. Generally, thinner films grown at lower temperature will have a lower degree of relaxation and thus be of higher quality. Complete or partial removal of the detached (111) silicon cleaved layer can serve to relieve this strain, leaving a relaxed thin film of GaN material amenable for further processing as described below.

In certain embodiments, the removal of the bulk material may take place chemically, for example with the detached thickness of single crystal silicon being removed by wet etching, for example by exposure to tetramethylammonium hydroxide (TMAH). Removal techniques other than wet etching are possible, for example dry etching or polishing.

In certain embodiments, non-thermal strain relaxation could be accomplished using a strain relaxation substrate (SRS). Such an SRS would have properties allowing relaxation in the strain of a grown GaN layer in a controlled manner avoiding the formation of defects.

As described in detail below, according to such embodiments, the non-thermal strain relaxation may involve one or more of the following steps.

1. Temporarily bond the GaN side of the silicon/GaN cleaved assembly onto a strain relaxation substrate (SRS).
2. Selectively etch the cleaved silicon thickness to the GaN layer.
3. Change the surface strain characteristics of the SRS to relax the GaN layer in a controlled manner.
4. Bond the relaxed GaN layer onto a growth support substrate, preferably one having a coefficient of thermal expansion (CTE) matched to that of GaN (see below).
5. Debond the SRS substrate, leaving the GaN on the growth support substrate.
6. Prepare the GaN surface for epitaxial growth (i.e. polish, cleaning)
7. Grow additional layers at higher temperatures (e.g. between about 900-1200° C.), using for example metalorganic chemical vapor deposition (MOCVD) and hydride vapor phase epitaxy (HVPE).

According to certain embodiments the SRS substrate could comprise, for example, a piezoelectronic (PZT) plate. In such an embodiment, a change in voltage applied to the PZT plate after its contact with the GaN, could alter one or more dimensions (L) of the PZT plate. In this manner an amount of surface strain between that SRS plate and the GaN attached thereto as a result of the SRS changed shape ($\Delta L/L$), could be controllably changed to reduce GaN defects.

According to other embodiments, the SRS substrate could comprise a material having a surface controllably changing between the solidus and liquidus states, for example based upon temperature. In such an embodiment the SRS substrate with a surface in the solidus state, could be bonded to the GaN side of the silicon/GaN cleaved assembly. As silicon is removed, the SRS surface could be transformed over time into the liquidus state (i.e. by an increase in temperature), thereby controlling strain in the film.

An embodiment of such a SRS is one featuring Indium or an alloy thereof, as a surface layer. Specifically, Indium experiences a transition from solidus to liquidus over a small enough temperature change from ambient (~160° C.), that significant additional strain in the GaN would not be expected to arise (see the discussion of GaN CTE below). Thus even where a temperature in change occurs, the thermal relaxation is referenced herein as "non-thermal".

It is noted that as the silicon of the silicon/GaN cleaved assembly is being removed, the ongoing strain could cause bowing of the remaining (thinned) silicon/GaN assembly. Thus according to certain embodiments, a SRS with sufficient plate rigidity could be used to constrain any unwanted out-of-plane movement.

Other techniques to relieve strain/stress arising from lattice spacing mismatch may be employed alone or in conjunction with post-growth etching. For example in certain embodiments, material may be selectively removed from the surface of the silicon substrate prior to growth, for example as a network of trenches. The extra space afforded by such removed material may serve to accommodate strain arising in a layer of material grown thereover.

Another technique which could be employed to relieve strain/stress arising from lattice mismatch, could be to control a shape of the underlying substrate that is present during formation of the material film. For example, a surface of the substrate could exhibit a convex shape that serves to match its lattice spacing with that of an overlying layer. Such a convex surface profile could be achieved by physically bending the substrate, and/or shaping the substrate.

Certain embodiments may utilize a detached and non-thermal strain relaxed thickness of semiconductor material, to serve as a template for the formation of additional material needed for optoelectronic devices. This additional film of material may thus exhibit a lattice structure compatible with the template. Due to its strain relaxed and substrate CTE matched characteristics, formation of an overlying film of semiconductor material could occur with low defect density. For example according to the Jothilingam paper the lattice structure of a detached thickness of (111) single crystal silicon, may be particularly suited to subsequent formation of thin, high quality GaN by MBE. Such a workpiece, particularly if subjected to non-thermal strain relaxation according to an embodiment, is in turn suited to allow GaN device formation through faster-operating processes at higher temperature.

In a next step 212, modified additional material may be bonded to a substrate, either temporarily or permanently. In certain embodiments, this substrate may comprise a material having a CTE compatible with conditions for creating more of the additional material. In particular, linear coefficient of thermal expansion of GaN ($\alpha_{GaN}$) is about $5.5 \times 10^{-6}$ $K^{-1}$.

Examples of such materials having CTE compatibility with GaN may include but are not limited to, metal alloys. Possible suitable metal alloys may comprise molybdenum, such as copper molybdenum alloys or molybdenum tungsten alloys.

For example, in an embodiment where initial GaN material was grown over single crystal silicon, following etching of the single crystal silicon and strain relaxation, the GaN material could be bonded to a metal substrate having a CTE compatible with high temperature processes capable of adding further GaN layer(s) at rates substantially higher than the relatively slow molecular beam epitaxy technique. Examples of such more rapid GaN growth processes include but are not limited to, metalorganic chemical vapor deposition (MOCVD) and hydride vapor phase epitaxy (HVPE).

In embodiments utilizing temporary bonding of a SRS substrate to the GaN, that SRS substrate could be removed prior to, or following, addition of the CTE-matched material. Where removal of the SRS occurs after addition of the CTE-matched material, that CTE-matched material could be present on an opposite side of the GaN.

In a next step 214, the surface of the stress-relieved additional material bound to the substrate, could then be polished to remove any roughness. The presence of the CTE-matched substrate bound to the detached thickness of material, could impart stability during such a polishing process.

The CTE-matched substrate bound to the additional material, could then be transported as a value added material for further processing, such as thickening of the additional material and incorporation into an illumination device.

The process flow of FIG. 2 just described, is intended to be exemplary only and not limiting. For example, the order in which the steps are performed may be different in other embodiments. Thus in alternative embodiments the CTE-matched substrate could be bonded to the substrate comprising the additional material, prior to stress relief/relaxation.

Figure 3:
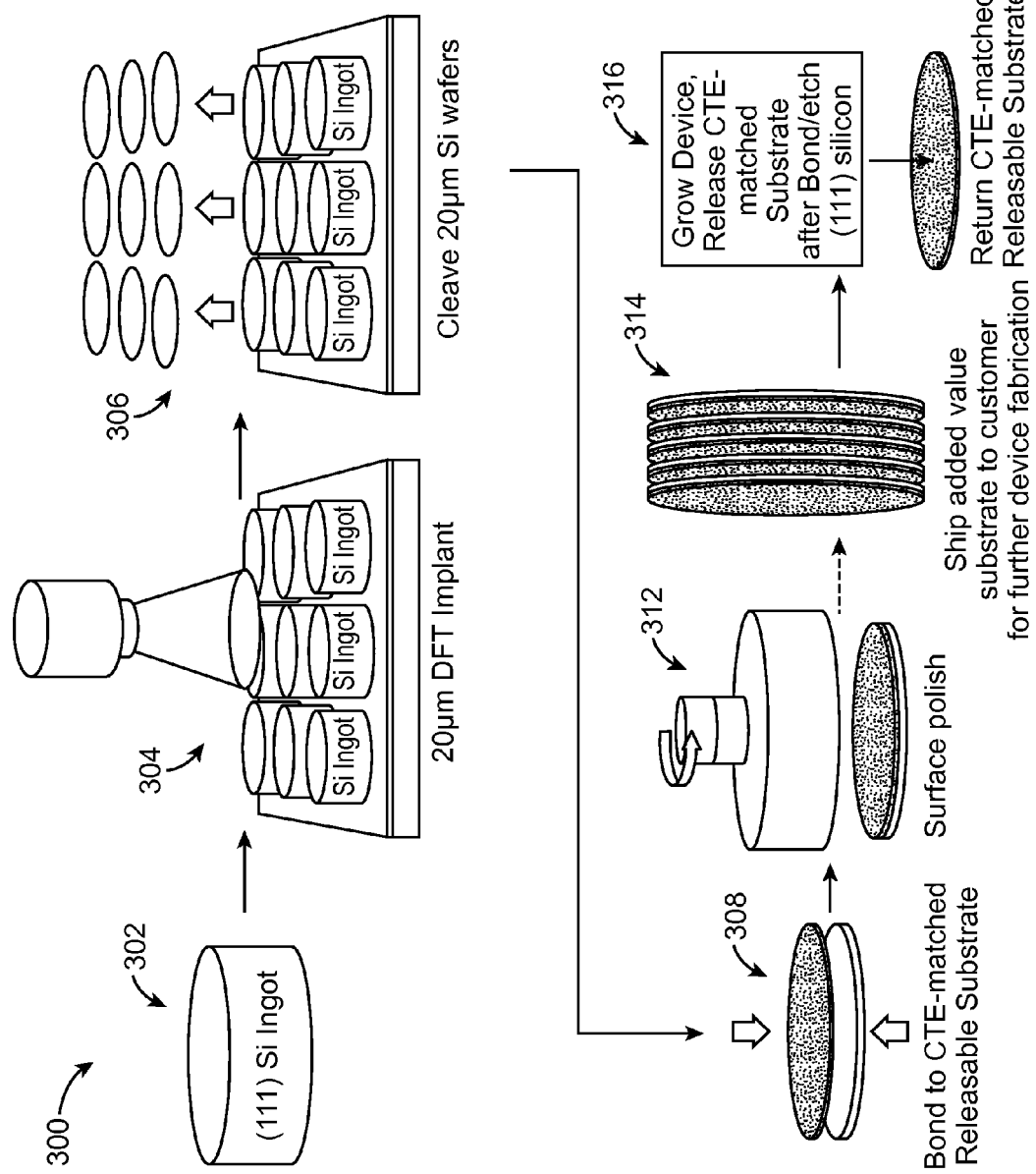
FIG. 3 is a simplified process flow illustrating another alternative embodiment.

FIG. 3 shows an example of a process flow 300 according to another embodiment. In a first step 302 of this a process flow, a single crystal silicon in bulk form as a Si ingot, is provided. This ingot may exhibit one of the typical crystalline orientations, for example (111).

In a next step 304, the surface of the ingot is subjected to implantation with accelerated particles, to form a cleave region. In certain embodiments, this cleave region may lie at a depth of between about 10-20 um underneath the additional material. Again, the particular characteristics of the implantation are determined by at least the factors indicated above.

The implantation may share characteristics with one or more of the incorporated patent applications.

In a next step 306, a thickness of the bulk material overlying the cleave region, is detached from the remaining bulk material to form a free standing layer. This cleaving may take place according to one or more characteristics described in the incorporated patent applications.

In step 308, the detached thickness of the bulk material is temporarily bonded to a substrate. In certain embodiments, this substrate may comprise a material having a coefficient of thermal expansion (CTE), compatible with conditions for creating material on top of the detached thickness of the bulk material.

The CTE mismatch over the growth temperature range can generate the following effective misfit (from Equation (3) of the Jothilingam paper):

$$F=\Delta T^*(\alpha_{Growth\ Substrate}-\alpha_{GaN})=\Delta T^*\Delta CTE$$

Depending on the growth temperature range and thickness, the effective misfit can be controlled by choosing a suitably CTE matched growth substrate (low $\Delta CTE$). Choosing the growth substrate characteristics to generate zero to slightly compressive stresses at higher temperature, can also help suppress the nucleation and growth of defects.

Again, one example is a substrate comprising metal having a CTE compatible with high temperature processes for forming GaN over a detached thickness of a (111) single crystal silicon bulk material. As described above in the Jothilingam paper and shown in FIG. 2A, the temperatures forming the thin, high quality films of GaN are on the order of 700-900° C. This is merely one example, however, and other embodiments could employ substrates having CTE compatibility over different temperature ranges.

In a next step 312, the surface of the detached thickness of the bulk material could be polished to remove any roughness resulting from the previous cleaving. The presence of the CTE-matched substrate bound to the detached thickness of material, could impart stability during such a polishing process.

As shown in step 314, the CTE-matched substrate bound to the detached thickness of bulk material, could then be transported as a value added product for further processing, such as the formation of additional material. Thus in one embodiment a workpiece comprising a detached thickness of (111) single crystal silicon bound to a metal substrate, could serve as a template for the formation of a thin, high quality layer of GaN according to the Jothilingam paper, which in turn could provide a template for the formation of further GaN utilizing faster-operating processes. In certain embodiments the presence of the bound CTE-matched substrate may help to reduce defect dislocations, since the underlying this CTE substrate could force the silicon layer to expand/contract to lessen defects.

As shown in step 316, prior to incorporating the semiconductor material into the illumination device, the CTE-matched substrate may be released from detached thickness of material to which it is bound. This release could take place utilizing a number of techniques, one of which being the removal of an intervening sacrificial layer. In embodiments involving silicon as the detached thickness of material, silicon oxide may be employed as such a sacrificial layer. Alternatively, the silicon of the detached thickness of material itself could be removed to release the CTE matched substrate from the additional material.

While the approach of FIG. 3 shows formation of a multi-layer substrate comprising bulk material and a CTE matched substrate prior to the growth of material thereon, this is not required. Alternative embodiments could employ a different sequence of steps and remain within the scope of the present invention.

Figure 3A:
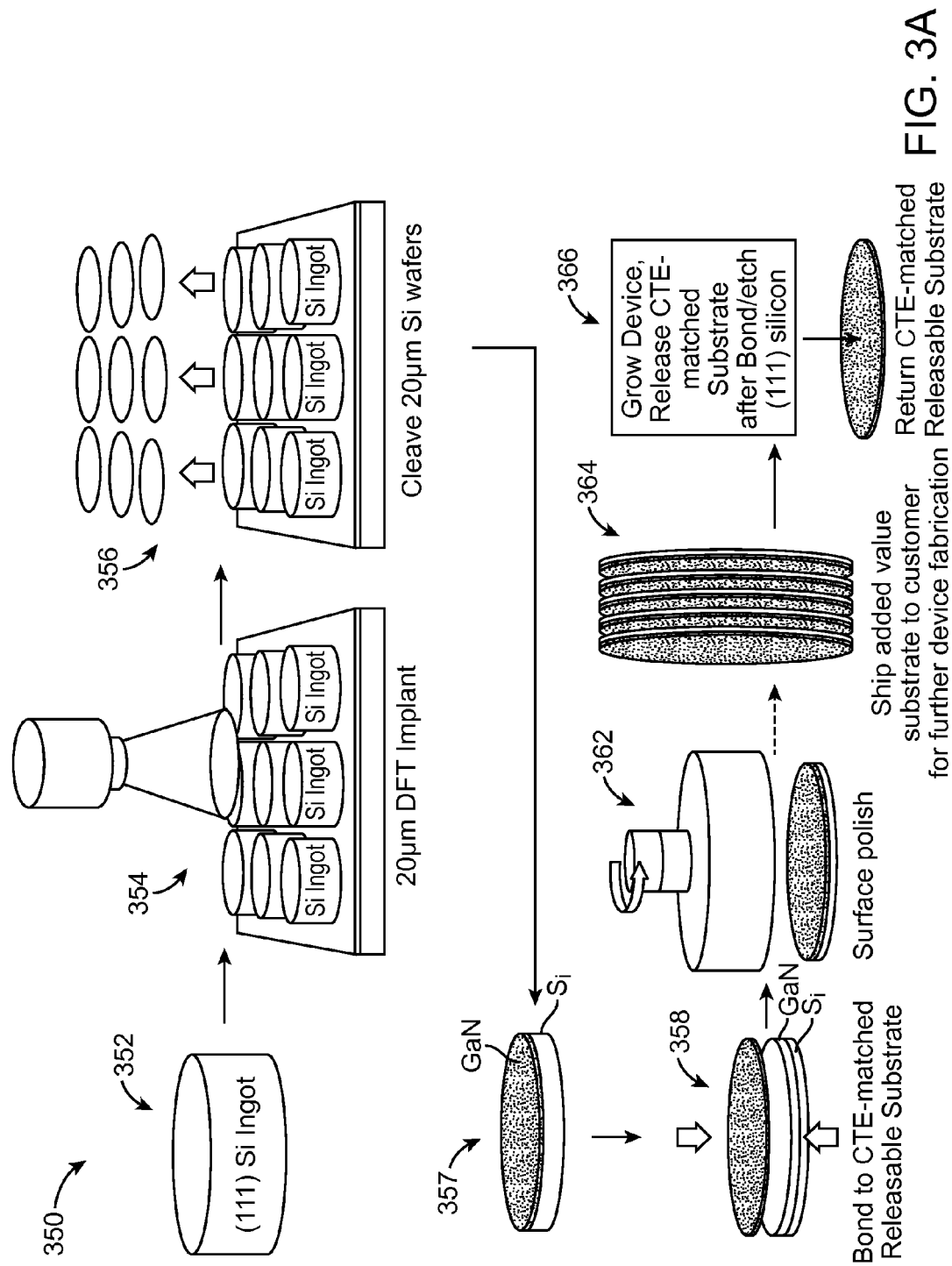
FIG. 3A is a simplified process flow illustrating another alternative embodiment.

For example, FIG. 3A shows a series of steps of an alternative embodiment 350 of a process flow. In a first step 352 of this a process flow, a single crystal silicon in bulk form as a Si ingot, is provided. This ingot may exhibit one of the typical crystalline orientations, for example (111).

In a next step 354, the surface of the ingot is subjected to implantation with accelerated particles, to form a cleave region. In certain embodiments, this cleave region may lie at a depth of between about 10-20 um underneath the additional material. Again, the particular characteristics of the implantation are determined by at least the factors indicated above. The implantation may share characteristics with one or more of the incorporated patent applications.

In a next step 356, a thickness of the bulk material overlying the cleave region, is detached from the remaining bulk material to form a free standing layer. This cleaving may take place according to one or more characteristics described in the incorporated patent applications.

In a next step 357, a film of material is formed over the free-standing layer. As described previously, in certain embodiments this film of material may be GaN formed at or below a critical thickness by MBE. However, this is only one example and is not required, and GaN or other materials may be formed under different conditions.

In a next step 358, the free standing layer bearing the film of material, may be bonded to a substrate (for example, substrate CTE matched to the film of material). According to various embodiments, the free standing layer bearing the film of material may be bonded to the substrate in a permanent or releasable manner, the latter allowing separation. In either approach, the presence of substrate may help to reduce defect dislocations, since the underlying CTE substrate could force the silicon layer to expand/contract to lessen defects.

Polishing 362 may be followed by shipping 364 of the multi-layer substrate comprising subsequent processing 366 as indicated.

One or more additional steps may be included in the process flow, including but not limited to stress/strain relaxation step(s) as discussed extensively above. In some approaches, material could be selectively removed from the surface of the free standing substrate prior to formation of the material film, in order to accommodate strain. Alternatively or in conjunction with this approach, some or a portion of the free standing substrate may be removed following material formation, prior to and/or after bonding to the releasable substrate. Alternatively or in conjunction, a convex shape could be imparted to the surface of the substrate (for example by physical bending and/or shaping) to result in reduced strain of the overlying material.

While the embodiments of FIGS. 3 and 3A describe the formation of a free-standing thickness of material by implantation followed by cleaving, this is not required. According to alternative embodiments, the free standing layer could be formed by other methods, for example a semiconductor wafer or a wiresawn solar wafer of standard thickness (e.g. 150-200 µm). In various embodiments, the surface of the wafer may be (i) polished or at least prepared adequately for use as a high quality growth surface, and/or (ii) laser cut to appropriate size, and/or (iii) etched later. Such alternative embodiments may offer a cost savings over the effort involved in implantation followed by initiation and propagation of a cleave front, as may be associated with controlled cleaving processes.

Figure 4:
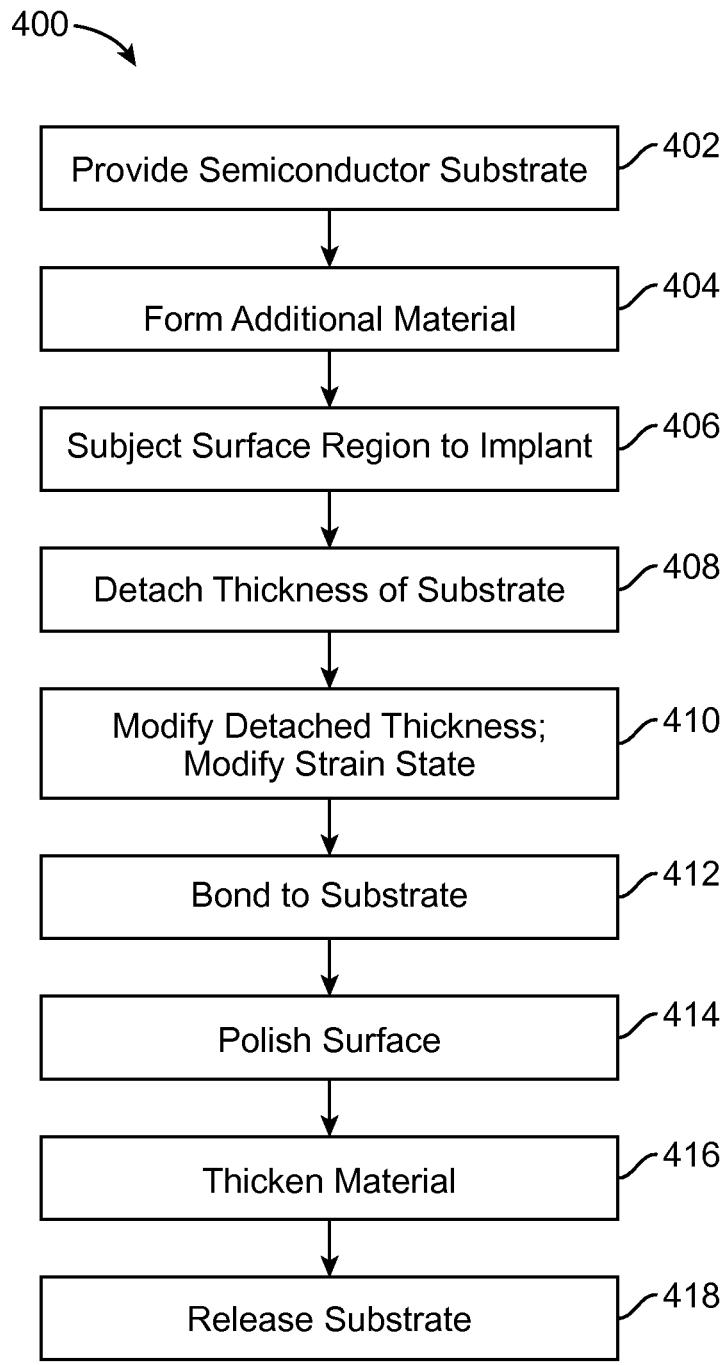
FIG. 4 is a chart showing various steps which may be employed to form an optoelectronic device according to certain embodiments.
Figure 5:
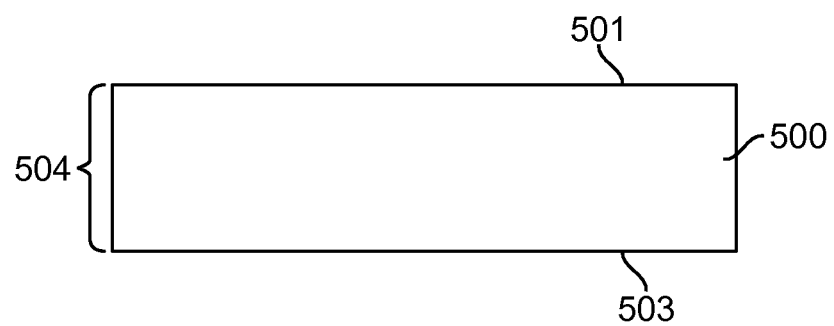
FIGS. 5-11 show certain steps of various layer transfer processes.

FIG. 4 is a chart 400 showing various steps which may be employed to form an optoelectronic device according to certain embodiments of the present invention.

1. Provide (402) a semiconductor substrate having a surface region and a thickness;
2. Optionally, form (404) a layer of additional material on the surface region;
3. Subject (406) the surface region of the semiconductor substrate (including any additional material formed thereon) to a first plurality of high velocity particles generated using a linear accelerator, to form a cleave region separated from the surface region by a thickness;
4. Detach (408) a thickness of the semiconductor substrate between the surface region and the cleave region, including any additional material.
5. Optionally, modify (410) the detached thickness of material (for example to remove partly or completely by etching to relieve stress in additional material) and modify its strain state to a more desirable state, for example using the various SRS modification steps as defined above.
6. Optionally, releasably or permanently bond (412) either the detached thickness of material or additional material, to a substrate (which may be a CTE-matched substrate).
7. Polish (414) a surface of the detached thickness of material or remaining additional material.
8. Optionally, thicken (416) existing additional material, or form additional material.
9. Optionally, release (418) the substrate from the detached thickness of material or the additional material.
10. Perform other steps as desired.

The above sequence of steps provide a method according to certain embodiments of the present invention. Other alternatives can also be provided where steps may be added, one or more steps may be removed, or one or more steps may be provided in a different sequence without departing from the scope of the claims herein.

For example, while the above describes implantation of particles through the additional layer to form a cleave region at a depth into the workpiece, this is not required. According to alternative embodiments, accelerated particles could be directed at the additional layer in a manner (e.g. energy) calculated to form a cleave region at or near an interface between the additional material and the underlying workpiece. The presence of the implanted particles in a region at or near this interface, could ultimately reduce an amount of applied energy required to initiate and/or propagate cleaving in a cleave region located proximate to the interface.

And while the above description has focused upon forming an additional material on a workpiece comprising single crystal silicon, this is also not required. According to alternative embodiments, the additional material could be present over another type of workpiece. One example of such a workpiece material is sapphire.

It is further noted that the choice of material for both the workpiece and for the additional layer, can play a role in determining a character of the stress/strain experienced by the additional layer. For example, the choice of workpiece/additional layer determines a relative mismatch in lattice spacing between them, which in turn can contribute to both the polarity (e.g. compressive or tensile) and magnitude of stress/strain arising within the additional layer. Furthermore, the choice of workpiece/additional layer may also determine a relative mismatch in coefficient in thermal expansion between them, which in turn can contribute to both the polarity and magnitude of stress/strain arising in the additional layer over a range of temperatures. In view of the above, the workpiece and/or the additional layer materials can be carefully selected to achieve a desired layer of stress/strain within the additional layer over various processing steps.

FIGS. 5-11 are simplified diagrams illustrating a method of forming substrates or free standing layers using a layer transfer process according to an embodiment of the present invention. These diagrams are merely examples, which should not unduly limit the scope of the claims recited herein. One of ordinary skill in the art would recognize many variations, modifications, and alternatives.

As shown, the method begins by providing a semiconductor substrate or semiconductor material in bulk form 500 having a surface region 501, a backside 503 and a thickness 504. Such thickness can be an entirety of an ingot or sliced from a larger ingot or the like. Specifically, the thickness 504 may represent that of an entirety of the bulk material in its original form (e.g. as an entire ingot, boule, tile, or plate), or may represent a thickness of the bulk material previously separated from its original form (e.g. by sawing or slicing an original ingot, boule, tile, or plate). In a specific embodiment, the semiconductor substrate or bulk material can be a single crystal silicon wafer or ingot, a polysilicon cast wafer, tile, or substrate, a silicon germanium wafer, a germanium wafer, a substrate of group III/V materials, group II/VI materials, gallium nitride, or the like. The substrate or bulk material can be a photonic material. Of course there can be other variations, modifications, and alternatives.

Figure 6:
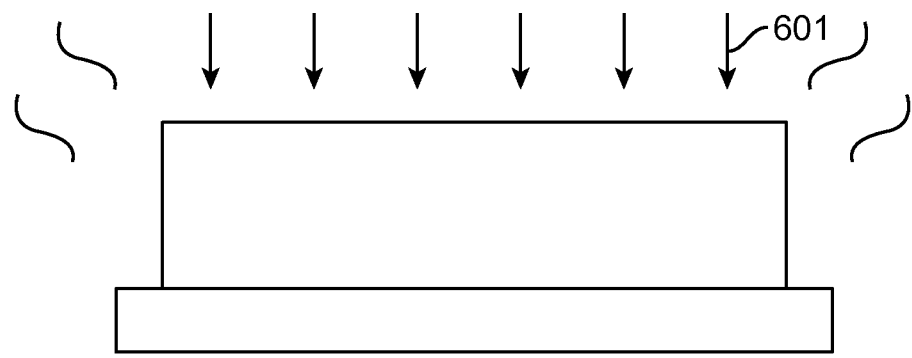

Referring to FIG. 6, the method includes subjecting the surface region of the semiconductor substrate or bulk material to a first plurality of high energy particles 601. In accordance with particular embodiments, the high energy particles 601 can be generated using a linear accelerator.

Figure 7:
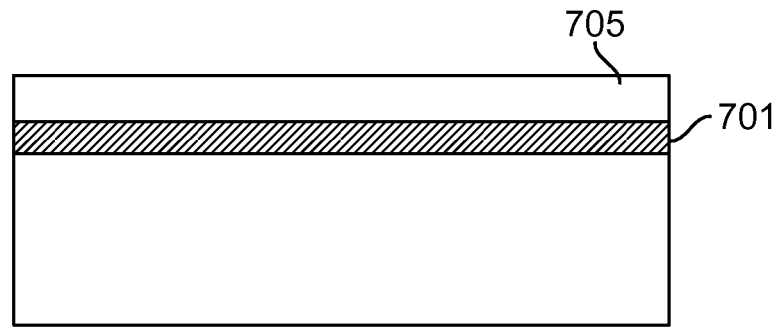

As shown in the simplified diagram of FIG. 7, in a specific embodiment the particles cause formation of a plurality of gettering sites or an accumulation region within a cleave region 701, which is provided beneath the surface region to define a thickness of the bulk material 705 that is to be detached (in some embodiments as a free standing layer). The first plurality of high energy particles may provide an implant profile having a peak concentration and a distribution spatially disposed within a depth of the semiconductor substrate. The distribution can have a width of about 2 μm and less, where this depth variation of an implant concentration profile is called the longitudinal straggle. For a 3.5 MeV hydrogen implant in silicon, the implant depth is about 120 μm, and the straggle is about 3 μm.

In certain embodiments, the cleave region is maintained at a first temperature, which can be provided directly or indirectly. That is, the temperature can be provided by convection, conduction, radiation, or a combination of these techniques according to a specific embodiment. Additionally, the high-energy particle beam may also provide part of the thermal energy and in combination with an external temperature source to achieve the desired implant temperature. In certain embodiments, the high-energy particle beam alone may provide the entire thermal energy desired for implant. That is, the high energy particle beam can be provided that directly causes energy to be converted into thermal energy to increase the temperature of the substrate or bulk material. Of course there can be other variations, modifications, and alternatives.

Depending upon the application, according to particular embodiments smaller mass particles are generally selected to decrease the energy requirement for implantation to a desired depth in a material and to reduce a possibility of damage to the material region according to a preferred embodiment. That is, smaller mass particles more easily travel through the substrate material to the selected depth without substantially damaging the material region that the particles traverse through. For example, the smaller mass particles (or energetic particles) can be almost any charged (e.g., positive or negative) and or neutral atoms or molecules, or electrons, or the like. In a specific embodiment, the particles can be neutral or charged particles including ions such as ion species of hydrogen and its isotopes, rare gas ions such as helium and its isotopes, and neon, or others depending upon the embodiment. The particles can also be derived from compounds such as gases, e.g., hydrogen gas, water vapor, methane, and hydrogen compounds, and other light atomic mass particles. Alternatively, the particles can be any combination of the above particles, and or ions and or molecular species and or atomic species. The particles generally have sufficient kinetic energy to penetrate through the surface to the selected depth underneath the surface.

For example, using hydrogen as the implanted species into the silicon wafer as an example, the implantation process is performed using a specific set of conditions. Implantation dose ranges of hydrogen from about $1\times10^{15}$ to about $5\times10^{17}$ atoms/cm$^2$, and preferably the dose of implanted hydrogen is less than about $8\times10^{16}$ atoms/cm$^2$, and may be less than about $5\times10^{16}$ atoms/cm$^2$. Implantation energy ranges from about 1 MeV and greater to about 2 MeV or even 5 MeV and greater, for the formation of thick films useful for photovoltaic applications. In certain embodiments implantation energy may be below 1 MeV, for example 0.5 MeV. Implantation temperature ranges from about −50 to about +50 Degrees Celsius, may be between about 100-250 Degree Celsius, and is preferably less than about 400 Degrees Celsius to prevent a possibility of hydrogen ions from diffusing out of the implanted silicon wafer. The hydrogen ions can be selectively introduced into the silicon wafer to the selected depth at an accuracy of about ±0.03 to ±1.5 microns. Of course, the type of ion used and process conditions depend upon the application.

For higher implant energies, it is particularly useful to have a substantially pure proton implantation (e.g., positive or negatively charged) to allow for a maximum range of the cleaving plane within the reusable substrate. Using silicon as an example, the energy range of implantation can be quite large and span from a few keV for template formation for photovoltaic absorber where a subsequent epitaxial growth is needed to maximize light absorbing efficiency to many MeV yielding substrates measuring hundreds of micron in thickness for use as a solar cell wafer starting material. The general range of implant depth as a function of the implant energy can be calculated using, for example SRIM 2003 (Stopping Range In Matter) or a Monte Carlo simulation program (http://www.srim.org/). In a specific embodiment, the silicon film thickness (which may be free standing) ranges from about 20 or 50 micrometers to about 200 micrometers using proton implant energy ranges from about 1 MeV to about 5 MeV. In other embodiments the silicon film may be a free standing silicon layer having a thickness from about 50 micrometers to about 200 micrometers. In certain embodiments the silicon film may have a thickness from about 10 micrometers to about 200 micrometers. Of course there can be other variations, modifications, and alternatives.

In a specific embodiment, a silicon film thickness ranges from about 10 um to about 200 um may be formed using a proton implant having an energy range of about 700 KeV to about 5 MeV. This range of silicon film thickness allows the detachment of a thickness of a single-crystal silicon substrate equivalent that can be used as a free standing silicon substrates. Single crystal silicon substrates or free standing layers in the thickness range of 50 um to 200 um according to embodiments of the present invention may be used to replace conventional methods of using wafer sawing, etching, and/or polishing processes. As opposed to about 50% kerf loss in the conventional technologies (kerf loss as being defined as the ratio of the material lost during the cutting and wafering operations), the implant cleaving technique according to embodiments of the present invention has virtually no kerf loss resulting in substantial cost savings and material utilization efficiency improvements.

In accordance with certain embodiments, implantation energies higher than 5 MeV may be used. Such high energies of implantation may be useful to fabricate thicker, free standing layers as substrates, or substrates of particular thickness from alternative materials in the fabrication of semiconductor devices. As an example, MeV range implant conditions have been disclosed by Reutov et al. (V. F. Reutov and Sh. Ibragimov, "Method for Fabricating Thin Silicon Wafers", USSR's Inventors Certificate No. 1282757, Dec. 30, 1983), which is hereby incorporated by reference. In V. G. Reutov and Sh. Sh. Ibragimov, the use of up to 7 MeV proton implantation with optional heating during implant and post-implant reusable substrate heating was disclosed to yield detached silicon wafer thicknesses up to 350 um. A thermal cleaving of a 16 micron silicon film using a 1 MeV hydrogen implantation was also disclosed by M. K. Weldon & al., "On the Mechanism of Hydrogen-Induced Exfoliation of Silicon", J. Vac. Sci. Technol., B 15(4), July/August 1997, which is hereby incorporated by reference. The terms "detached" or "transferred silicon thickness" in this context mean that the silicon film thickness formed by the implanted ion range can be released to a free standing state or released to a permanent substrate or a temporary substrate for eventual use as a free standing substrate, or eventually mounted onto a permanent substrate. In some embodiments, the silicon material is sufficiently thick and free from a handle or transfer substrate, which acts as a supporting member. Of course, the particular process for handling and processing of the film will depend on the specific process and application.

Figure 8:
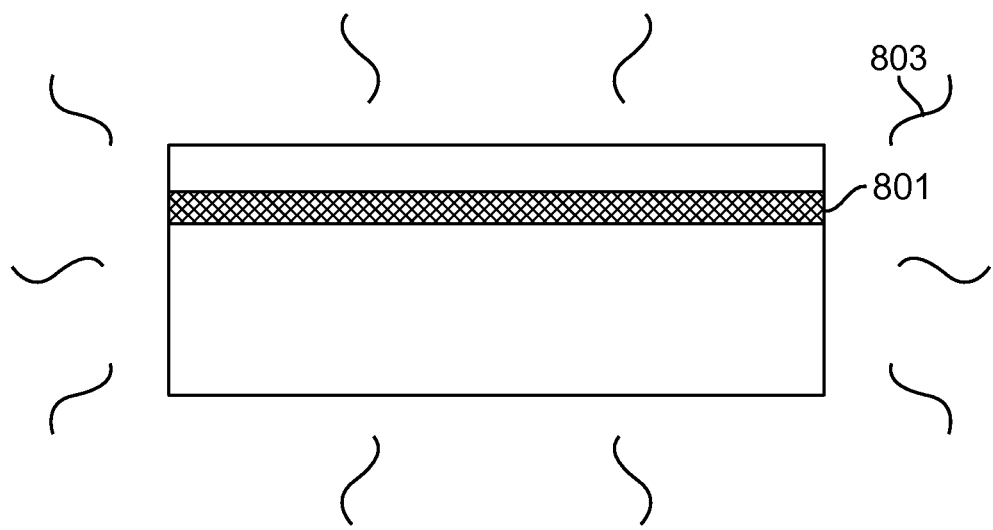

Referring now to FIG. 8, an embodiment in accordance with the present invention may optionally perform a thermal treatment process 803 on the semiconductor substrate or bulk material to further form the plurality of gettering sites within the cleave region. That is, the thermal treatment process anneals out and/or quenches the cleave region to fix 801 the plurality of first particles in place. The thermal treatment provides a fixed network of defects that can act as efficient sites for gettering and accumulating particles in a subsequent implantation or particle accumulation/diffusion process.

Without being tied to a particular theory or mechanism, in a specific embodiment, the increased temperature is believed to precipitate a network of permanent defects, and may also trap a substantial portion of hydrogen from the first plurality of particles. The defect layer, which is substantially permanent, provides a site for efficient collection and trapping of particles from a subsequent implant and/or diffusion process, which will be described in more detail throughout the present specification and more particularly below.

In accordance with one embodiment, the optional thermal treatment can occur using conduction, convection, radiation, or any combination of these techniques. The high-energy particle beam may also provide part of the thermal energy and in combination with an external temperature source to achieve the desired implant temperature. In certain embodiments, the high-energy particle beam alone may provide the entire thermal energy desired for implant. Of course, there can be other variations, modifications, and alternatives.

Figure 9:
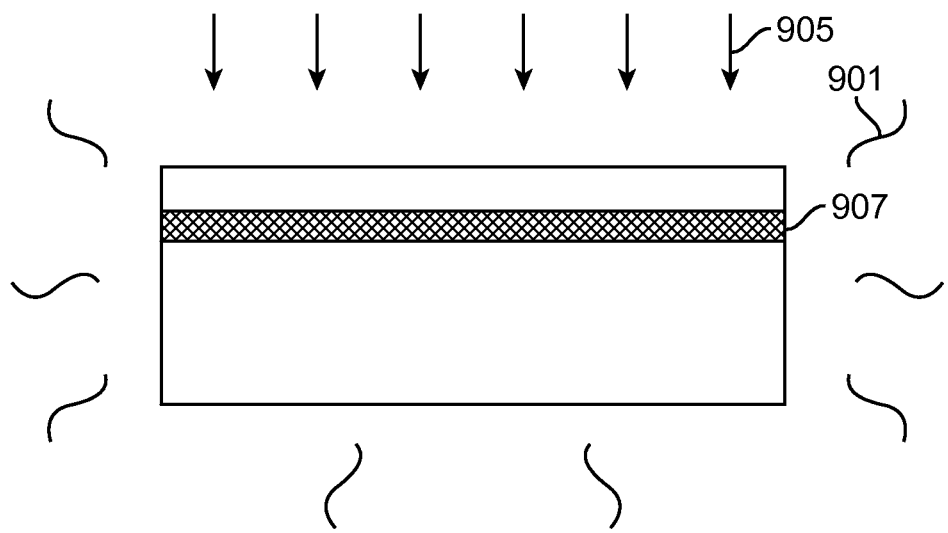

A specific embodiment may include subjecting the surface region of the semiconductor substrate or bulk material to a second plurality of high energy particles, which may be generated using the linear accelerator, as illustrated in the simplified diagram of FIG. 9. As shown, the method includes the second plurality of high energy particles 905, which are provided in the semiconductor substrate or bulk material. The second particles are introduced into the cleave region 907, which increases a stress level of the cleave region from a first stress level to a second stress level from the second plurality of high velocity particles. In a specific embodiment, the second stress level is suitable for a subsequent cleaving process. In a particular embodiment, the semiconductor substrate or bulk material is maintained at a second temperature 901, which is higher than the first temperature.

Using hydrogen as the species implanted into the bulk single crystal silicon wafer material in the second implantation step as an example, the implantation process is performed using a specific set of conditions. Implantation dose ranges from about $5 \times 10^{15}$ to about $5 \times 10^{17}$ atoms/cm$^2$, and preferably the dose is less than about $1 \times 10^{17}$ atoms/cm$^2$. Implantation energy ranges from about 0.5 MeV and greater to about 2 or 5 MeV and greater for the formation of thick films. Implant dose rate can be provided at about 500 microamperes to about 100 milliamperes and a total dose rate can be calculated by integrating an implantation rate over the expanded beam area. Implantation temperature ranges from about −50 Degree Celsius to about 550 Degrees Celsius, and is preferably less than about 400 Degrees Celsius. The hydrogen ions can be selectively introduced into the silicon wafer to the selected depth at an accuracy of about ±0.03 to ±1.5 microns. In a specific embodiment, the temperature and dose are selected to allow for efficient capture of molecular hydrogen, while there may be some diffusion of mono-atomic hydrogen. Of course, the type of ion used and process conditions depend upon the application.

For higher implant energies as noted above, it may be useful to have a substantially pure proton implantation (e.g., positive or negatively charged) to allow for a maximum range of the cleaving plane within the reusable substrate. Using silicon as an example, the energy range of implantation can be quite large and span from a few keV for template formation for photovoltaic absorber where a subsequent epitaxial growth is needed to maximize light absorbing efficiency to many MeV yielding substrates measuring hundreds of micron in thickness for use as a solar cell wafer starting material. The general range of implant depth as a function of the implant energy can be calculated using, for example SRIM 2003 (Stopping Range In Matter) or a Monte Carlo simulation program (http://www.srim.org/). In a specific embodiment, the silicon film thickness ranges from about 50 micrometers to about 100 micrometers using proton implant energy ranges from about 2 MeV to about 3.25 or 5 MeV. Of course there can be other variations, modifications, and alternatives.

Effectively, the implanted particles add stress or reduce fracture energy along a plane parallel to the top surface of the substrate or bulk material at the selected depth. The energies depend, in part, upon the implantation species and conditions. These particles reduce a fracture energy level of the substrate or bulk material at the selected depth. This allows for a controlled cleave along the implanted plane at the selected depth. Implantation can occur under conditions such that the energy state of the substrate or bulk material at all internal locations is insufficient to initiate a non-reversible fracture (i.e., separation or cleaving) in the substrate or bulk material. It should be noted, however, that implantation does generally cause a certain amount of defects (e.g., micro-detects) in the substrate or bulk material that can typically at least partially be repaired by subsequent heat treatment, e.g., thermal annealing or rapid thermal annealing.

A mass-selected high-energy implant approach, which has the appropriate beam intensity. To be cost-effective, the implant beam current should be on the order of a few tens of milliamps of H$^+$ or H$^−$ ion beam current. If the system can implant such sufficiently high energies, H$_{2+}$ ions can also be advantageously utilized for achieving higher dose rates. Ion implant apparatuses useful for embodiments of the present invention have been made recently available by the use of DC electrostatic particle accelerators such as the DYNAMITRON proton accelerator available from Ion Beam Applications SA, Belgium). Other forms of DC electrostatic accelerators which may be used include Van de Graaff or Tandem Van de Graaff accelerator types.

Still other forms of particle accelerators suitable for use in accordance with embodiments of the present invention may include radio frequency (RF) particle accelerators such as a cyclotron or a RF linear accelerator (RF Linac). Examples of possible particle accelerator types include radio-frequency quadrupole linear accelerator (RFQ-Linac) or Drift-Tube Linac (DTL), or RF (Radio)-Focused Interdigitated (RFI) technology. These are available from companies such as Accsys Technology Inc. of Pleasanton, Calif., Linac Systems, LLC of Albuquerque, N. Mex. 87109, and others.

In a specific embodiment, these approaches use RF acceleration of an extracted proton beam to increase the total energy of the proton beam from a range of approximately 20-100 keV to 0.5 to 7 MeV or more. The output beam is usually on the order of a few millimeters in diameter and for use in this application would require the use of beam expansion to the order of a few hundred millimeters on a side to a meter or more in order to keep the power flux impinging on the target surface from becoming too large and possibly overheating or damaging the target surface. The proton current available with these technologies can be up to 100 mA or more. As a specific example, assuming 100 kW of beam power, a 3.25 MeV RFQ/RFI-Linac would yield a proton beam current of about 31 mA. Using a dose of approximately $1 \times 10^{16}$ H/cm$^2$ and an expanded beam of about 500 mm×500 mm, the silicon area processed per hour at the target implantation dose is about 7 square meters while the power flux is kept to about 13 Watts/cm$^2$. This combination of parameters makes this approach particularly practical for cost effective solar cell production. Of course, there can be other variations, alternatives, and modifications.

Optionally, specific embodiments may include a thermal treatment process after the implanting process. According to a specific embodiment, the present method uses a thermal process ranging from about 450 to about 600 Degrees Celsius for silicon material. In a preferred embodiment, the thermal treatment can occur using conduction, convection, radiation, or any combination of these techniques. The high-energy particle beam may also provide part of the thermal energy and in combination with an external temperature source to achieve the desired implant temperature. In certain embodiment, the high-energy particle beam alone may provide the entire thermal energy desired for implant. In a preferred embodiment, the treatment process occurs to season the cleave region for a subsequent cleave process. Of course, there can be other variations, modifications, and alternatives.

Figure 10:
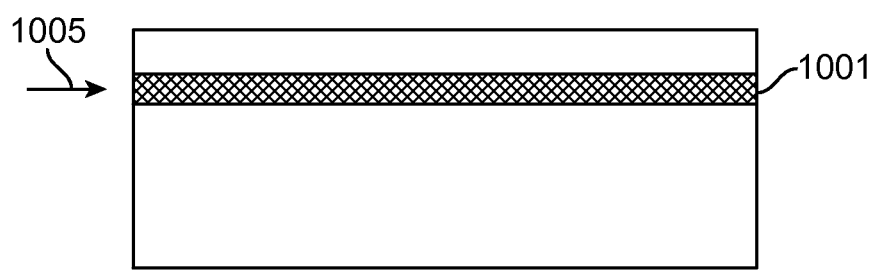

Specific embodiments may include a cleave initiation step, wherein some energy 1005 is applied to the cleave portion to begin cleaving, as is illustrated in FIG. 10. As described in detail below, this cleave initiation could involve the application of different types of energy, having different characteristics.

Figure 11:
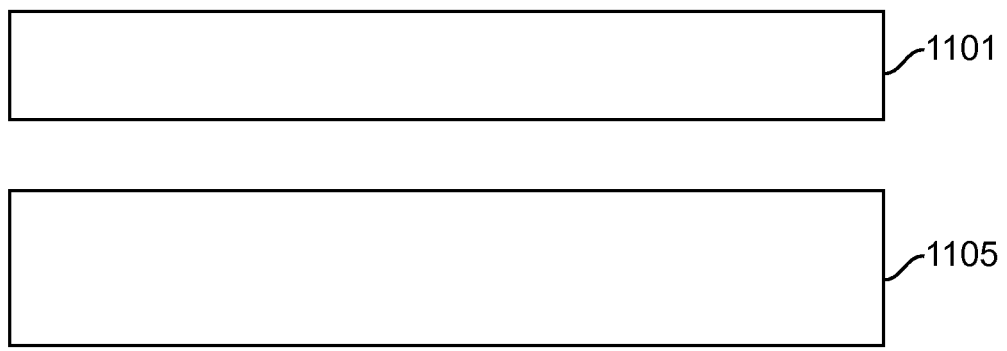

Specific embodiments include a step of freeing the thickness of detachable material, (which may or may not be free standing), using a cleaving process, as illustrated by FIG. 11. As shown, the detachable material 1101 is removed from the remaining substrate portion or bulk material 1105. In a specific embodiment, the step of freeing can be performed using a controlled cleaving process. The controlled cleaving process provides a selected energy within a portion of the cleave region of the donor substrate. As merely an example, the controlled cleaving process has been described in U.S. Pat. No. 6,013,563 titled Controlled Cleaving Process, commonly assigned to Silicon Genesis Corporation of San Jose, Calif., and hereby incorporated by reference for all purposes. As shown, the method in accordance with an embodiment of the present invention frees the thickness of material (which may be free standing) from the substrate or bulk material to completely remove the thickness of material. Of course, there can be other variations, alternatives, and modifications.

A method may use one or more patterned regions to facilitate initiation of a cleaving action. In a specific embodiment, the present method provides a semiconductor substrate having a surface region and a thickness. The method includes subjecting the surface region of the semiconductor substrate to a first plurality of high energy particles generated using a linear accelerator to form a patterned region of a plurality of gettering sites within a cleave region. In a preferred embodiment, the cleave region is provided beneath the surface region to defined a thickness of material to be detached. The semiconductor substrate is maintained at a first temperature. The method also includes subjecting the semiconductor substrate to a treatment process, e.g., thermal treatment. The method includes subjecting the surface region of the semiconductor substrate to a second plurality of high energy particles, which have been provided to increase a stress level of the cleave region from a first stress level to a second stress level. The method includes initiating the cleaving action at a selected region of the patterned region to detach a portion of the thickness of detachable material using a cleaving process and freeing the thickness of detachable material using a cleaving process.

In one embodiment, the patterned implant sequence subjects the surface to a dose variation where the initiation area is usually developed using a higher dose and/or thermal budget sequence. Propagation of the cleaving action to complete the cleaving action can occur using additional dosed regions to guide the propagating cleave front. Alternatively, cleaving propagation can be accomplished by following a depth that is guided using stress-control. Propagation of the cleaving can be achieved by following a natural crystallographic cleave plane. One or more of these techniques may be applied in conjunction with one another. Some or most of the area may be implanted at a lesser dose or not implanted at all depending on the particular cleaving technique used. Such lower dosed regions can help improve overall productivity of the implantation system by reducing the total dose needed to detach each film from the substrate.

In a specific embodiments, methods can perform other processes. For example, the method can place the thickness of detached material on a support member, which is later processed. Additionally or optionally, the method in accordance with an embodiment of the present invention performs one or more processes on the semiconductor substrate or bulk material before subjecting the surface region with the first plurality of high energy particles, or between the implanting step(s) and the cleaving step. Depending upon the particular embodiment, the processes can be for the formation of illumination devices, or layers used within a cell process, integrated circuits, optical devices, any combination of these, and the like. Of course, there can be other variations, modifications, and alternatives.

As described above, improved techniques for removing a thin film of material from a substrate using a controlled cleaving action are provided. This technique allows an initiation of a cleaving process on a substrate using a single or multiple cleave region(s) through the use of controlled energy (e.g., spatial distribution) and selected conditions to allow an initiation of a cleave front(s) and to allow it to propagate through the substrate to remove a thin film of material from the substrate.

In a specific embodiment, a process is provided for forming a film of material from a donor substrate using a controlled cleaving process. The process includes a step of introducing energetic particles (e.g., charged or neutral molecules, atoms, or electrons having sufficient kinetic energy) through a surface of a donor substrate to a selected depth underneath the surface, where the particles are at a relatively high concentration to define a thickness of donor substrate material (e.g., thin film of detachable material) above the selected depth. To cleave the donor substrate material, the method provides energy to a selected region of the donor substrate to initiate a controlled cleaving action in the donor substrate, whereupon the cleaving action is made using a propagating cleave front(s) to free the donor material from a remaining portion of the donor substrate.

A cleave may be initiated by subjecting the material with sufficient energy to fracture the material in one region, causing a cleave front, without uncontrolled shattering or cracking. The cleave front formation energy (E) must often be made lower than the bulk material fracture energy (Etna) at each region to avoid shattering or cracking the material. The directional energy impulse vector in diamond cutting or the scribe line in glass cutting are, for example, the means in which the cleave energy is reduced to allow the controlled creation and propagation of a cleave front. The cleave front is in itself a higher stress region and once created, its propagation requires a lower energy to further cleave the material from this initial region of fracture. The energy required to propagate the cleave front is called the cleave front propagation energy (4). The relationship can be expressed as:

$$Ec=Ep+[\text{cleave front stress energy}]$$

A controlled cleaving process is realized by reducing Ep along a favored direction(s) above all others and limiting the available energy to below the Ep of other undesired directions. In any cleave process, a better cleave surface finish occurs when the cleave process occurs through only one expanding cleave front, although multiple cleave fronts do work.

Numerous benefits are achieved over pre-existing techniques using the present invention. In particular, the present invention uses controlled energy and selected conditions to preferentially cleave a thin film of material from a donor substrate which includes multi-material sandwiched films. This cleaving process selectively removes the thin film of material from the substrate while preventing a possibility of damage to the film or a remaining portion of the substrate. Accordingly, the remaining substrate portion can be re-used repeatedly for other applications.

Additionally, the present invention uses a relatively low temperature during the controlled cleaving process of the thin film to reduce temperature excursions of the separated film, donor substrate, or multi-material films according to other embodiments. This lower temperature approach allows for more material and process latitude such as, for example, cleaving and bonding of materials having substantially different thermal expansion coefficients. In other embodiments, the present invention limits energy or stress in the substrate to a value below a cleave initiation energy, which generally removes a possibility of creating random cleave initiation sites or fronts. This reduces cleave damage (e.g., pits, crystalline defects, breakage, cracks, steps, voids, excessive roughness) often caused in pre-existing techniques. Moreover, the present invention reduces damage caused by higher than necessary stress or pressure effects and nucleation sites caused by the energetic particles as compared to pre-existing techniques.

1. Controlled Cleaving Techniques

Figure 12:
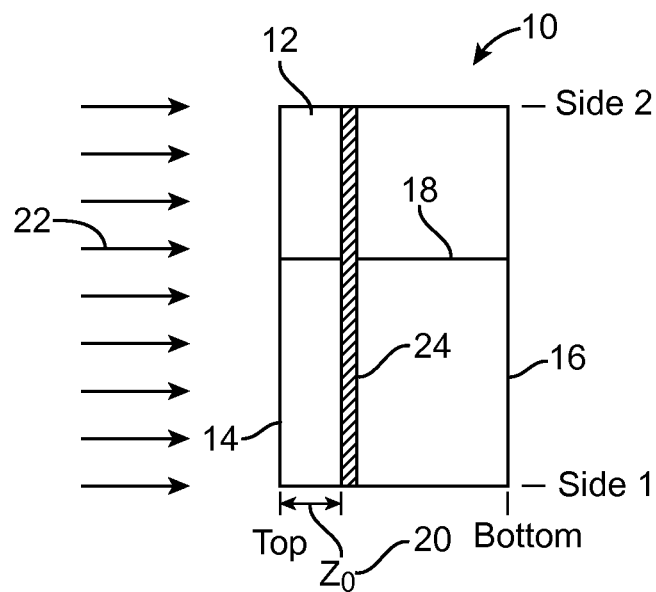
FIGS. 12-22 are simplified diagrams illustrating a controlled cleaving technique.

FIG. 12 is a simplified cross-sectional view diagram of a substrate 10 according to the present invention. The diagram is merely an illustration and should not limit the scope of the claims herein. As merely an example, substrate 10 is a silicon wafer which includes a material region 12 to be removed, which is a thin relatively uniform film derived from the substrate material. The silicon wafer 10 includes a top surface 14, a bottom surface 16, and a thickness 18. Substrate 10 also has a first side (side 1) and a second side (side 2) (which are also referenced below in the Figs.). Material region 12 also includes a thickness 20, within the thickness 18 of the silicon wafer. A novel technique removes the material region 12 using the following sequence of steps.

Selected energetic particles implant 22 through the top surface 14 of the silicon wafer to a selected depth 24, which defines the thickness 20 of the material region 12, termed the "thin film" of material. A variety of techniques can be used to implant the energetic particles into the silicon wafer. These techniques include ion implantation using, for example, beam line ion implantation equipment manufactured from companies such as Applied Materials, Eaton Corporation, Varian, and others. Alternatively, implantation occurs using a plasma immersion ion implantation ("PIII") technique. Examples of plasma immersion ion implantation techniques are described in "Recent Applications of Plasma Immersion Ion Implantation," Paul K. Chu, Chung Chan, and Nathan W. Cheung, SEMICONDUCTOR INTERNATIONAL, pp. 165-172, June 1996, and "Plasma Immersion Ion Implantation—A Fledgling Technique for Semiconductor Processing," P. K. Chu, S. Qin, C. Chan, N. W. Cheung, and L. A. Larson, MATERIALS SCIENCE AND ENGINEERING REPORTS: A REVIEW JOURNAL, pp. 207-280, Vol. R17, Nos. 6-7, (Nov. 30, 1996), which are both hereby incorporated by reference for all purposes. Of course, techniques used depend upon the application.

Depending upon the application, smaller mass particles are generally selected to reduce a possibility of damage to the material region 12. That is, smaller mass particles easily travel through the substrate material to the selected depth without substantially damaging the material region that the particles traverse through. For example, the smaller mass particles (or energetic particles) can be almost any charged (e.g., positive or negative) and/or neutral atoms or molecules, or electrons, or the like. In a specific embodiment, the particles can be neutral and/or charged particles including ions such as ions of hydrogen and its isotopes, rare gas ions such as helium and its isotopes, and neon. The particles can also be derived from compounds such as gases, e.g., hydrogen gas, water vapor, methane, and hydrogen compounds, and other light atomic mass particles. Alternatively, the particles can be any combination of the above particles, and/or ions and/or molecular species and/or atomic species. The particles generally have sufficient kinetic energy to penetrate through the surface to the selected depth underneath the surface.

Using hydrogen as the implanted species into the silicon wafer as an example, the implantation process is performed using a specific set of conditions. Implantation dose ranges from about $10^{15}$ to about $10^{18}$ atoms/cm$^2$, and preferably the dose is greater than about $10^{16}$ atoms/cm$^2$. Implantation energy ranges from about 100 KeV to about 5 MeV, and is generally about 50 KeV. Implantation temperature ranges from about −200 to about 600 C., and is preferably less than about 40° C. to prevent a possibility of a substantial quantity of hydrogen ions from diffusing out of the implanted silicon wafer and annealing the implanted damage and stress. The hydrogen ions can be selectively introduced into the silicon wafer to the selected depth at an accuracy of about +/−0.03 to +/−0.05 microns. Of course, the type of ion used and process conditions depend upon the application.

Effectively, the implanted particles add stress or reduce fracture energy along a plane parallel to the top surface of the substrate at the selected depth. The energies depend, in part, upon the implantation species and conditions. These particles reduce a fracture energy level of the substrate at the selected depth. This allows for a controlled cleave along the implanted plane at the selected depth. Implantation can occur under conditions such that the energy state of the substrate at all internal locations is insufficient to initiate a non-reversible fracture (i.e., separation or cleaving) in the substrate material. It should be noted, however, that implantation does generally cause a certain amount of defects (e.g., micro-defects) in the substrate that can typically at least partially be repaired by subsequent heat treatment, e.g., thermal annealing or rapid thermal annealing.

Figure 13:
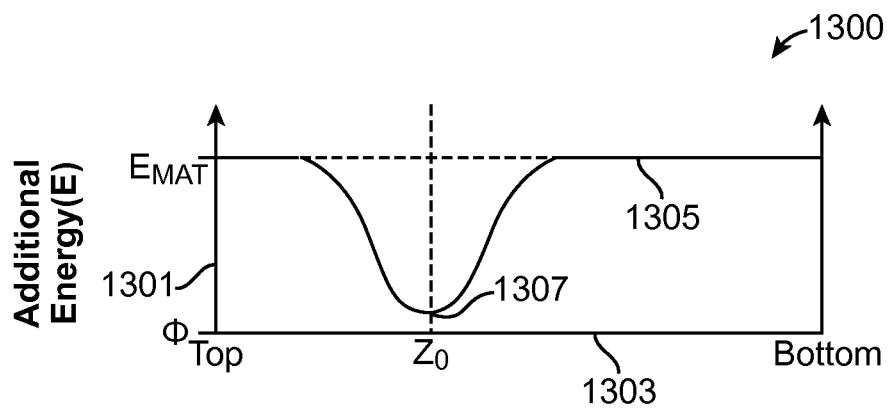

FIG. 13 is a simplified energy diagram 1300 along a cross-section of the implanted substrate 10 according to the present invention. The diagram is merely an illustration and should not limit the scope of the claims herein. The simplified diagram includes a vertical axis 1301 that represents an energy level (E) (or additional energy) to cause a cleave in the substrate. A horizontal axis 1303 represents a depth or distance from the bottom of the wafer to the top of the wafer. After implanting particles into the wafer, the substrate has an average cleave energy represented as E 1305, which is the amount of energy needed to cleave the wafer along various cross-sectional regions along the wafer depth. The cleave energy (Ec) is equal to the bulk material fracture energy (Emat) in non-implanted regions. At the selected depth 20, energy (Ecz) 1307 is lower since the implanted particles essentially break or weaken bonds in the crystalline structure (or increase stress caused by a presence of particles also contributing to lower energy (Ecz) 1307 of the substrate) to lower the amount of energy needed to cleave the substrate at the selected depth. The present invention takes advantage of the lower energy (or increased stress) at the selected depth to cleave the thin film in a controlled manner.

Figure 14:
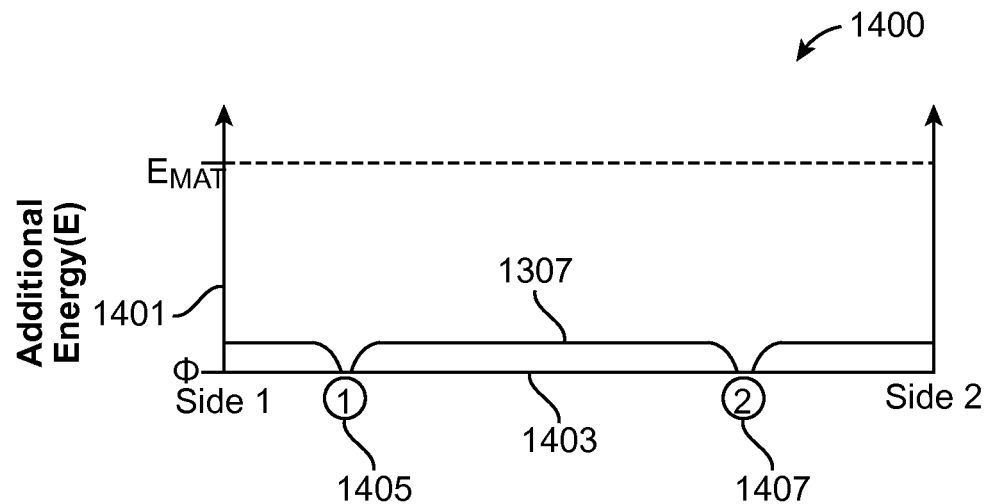

Substrates, however, are not generally free from defects or "weak" regions across the possible cleave front or selected depth $z_o$ after the implantation process. In these cases, the cleave generally cannot be controlled, since they are subject to random variations such as bulk material non-uniformities, built-in stresses, defects, and the like. FIG. 14 is a simplified energy diagram 1400 across a cleave front for the implanted substrate 10 having these defects. The diagram 1400 is merely an illustration and should not limit the scope of the claims herein. The diagram has a vertical axis 1401 which represents additional energy (E) and a horizontal axis 1403 which represents a distance from side 1 to side 2 of the substrate, that is, the horizontal axis represents regions along the cleave front of the substrate. As shown, the cleave front has two regions 1405 and 1407 represented as region 1 and region 2, respectively, which have cleave energies less than the average cleave energy (Ecz) 1307 (possibly due to a higher concentration of defects or the like). Accordingly, it is highly likely that the cleave process begins at one or both of the above regions, since each region has a lower cleave energy than surrounding regions.

Figure 15:
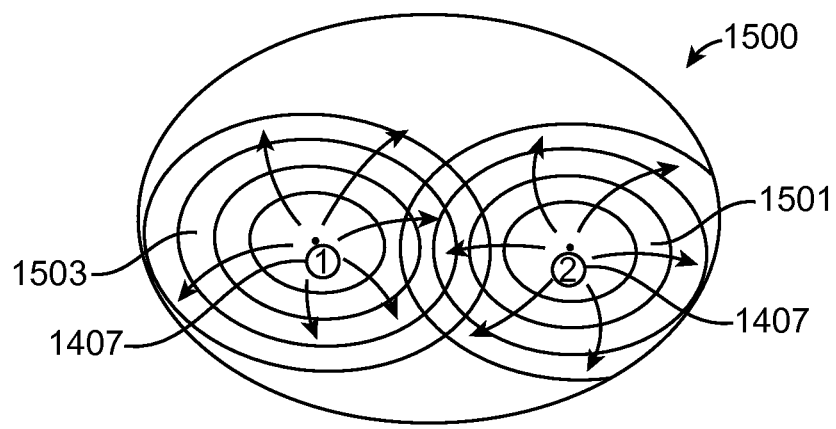

An example of a cleave process for the substrate illustrated by the above FIG. 14 is described as follows with reference to FIG. 15. FIG. 15 is a simplified top-view diagram 1500 of multiple cleave fronts 1501, 1503 propagating through the implanted substrate. The cleave fronts originate at "weaker" regions in the cleave plane, which specifically includes regions 1 and 2. The cleave fronts originate and propagate randomly as shown by the arrows. A limitation with the use of random propagation among multiple cleave fronts is the possibility of having different cleave fronts join along slightly different planes or the possibility of forming cracks, which is described in more detail below.

Figure 16:
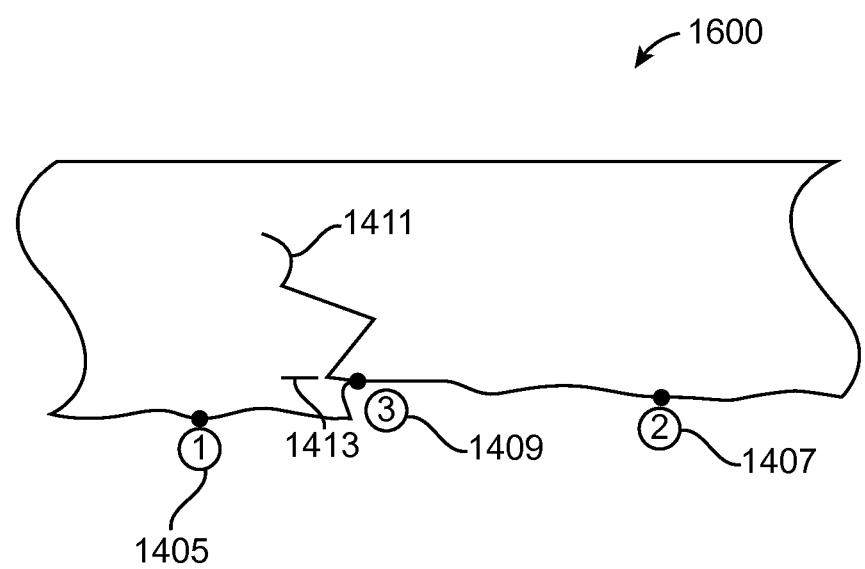

FIG. 16 is a simplified cross-sectional view 1600 of a film cleaved from a wafer having multiple cleave fronts at, for example, regions 1 1405 and 2 1407. This diagram is merely an illustration and should not limit the scope of the claims herein. As shown, the cleave from region 1 joined with the cleave from region 2 at region 3 1409, which is defined along slightly different planes, may initiate a secondary cleave or crack 1411 along the film. Depending upon the magnitude of the difference 1413, the film may not be of sufficient quality for use in manufacture of substrates for integrated circuits or other applications. A substrate having crack 1411 generally cannot be used for processing. Accordingly, it is generally undesirable to cleave a wafer using multiple fronts in a random manner. An example of a technique which may form multiple cleave fronts in a random manner is described in U.S. Pat. No. 5,374,564, which is in the name of Michel Bruel ("Bruel"), and assigned to Commissariat A l'Energie Atomique in France. Bruel generally describes a technique for cleaving an implanted wafer by global thermal treatment (i.e., thermally treating the entire plane of the implant) using thermally activated diffusion. Global thermal treatment of the substrate generally causes an initiation of multiple cleave fronts which propagate independently. In general, Bruel discloses a technique for an "uncontrollable" cleaving action by way of initiating and maintaining a cleaving action by a global thermal source, which may produce undesirable results. These undesirable results include potential problems such as an imperfect joining of cleave fronts, an excessively rough surface finish on the surface of the cleaved material since the energy level for maintaining the cleave exceeds the amount required, and many others. The present invention overcomes the formation of random cleave fronts by a controlled distribution or selective positioning of energy on the implanted substrate.

Figure 17:
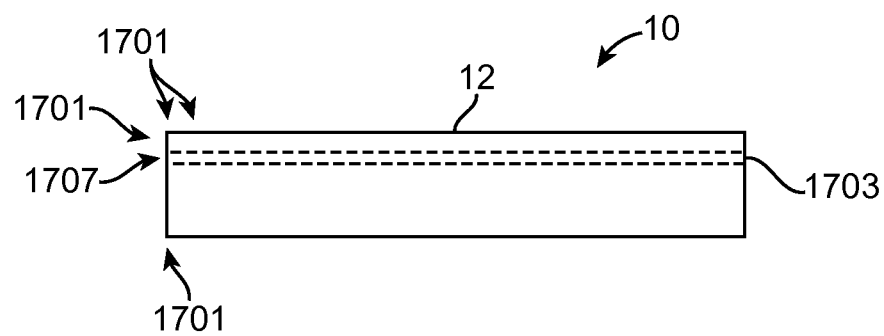

FIG. 17 is a simplified cross-sectional view of an implanted substrate 10 using selective positioning of cleave energy according to the present invention. This diagram is merely an illustration, and should not limit the scope of the claims herein. The implanted wafer undergoes a step of selective energy placement or positioning or targeting which provides a controlled cleaving action of the material region 12 at the selected depth. The impulse or impulses are provided using energy sources. Examples of sources include, among others, a chemical source, a mechanical source, an electrical source, and a thermal sink or source. The chemical source can include particles, fluids, gases, or liquids. These sources can also include a chemical reaction to increase stress in the material region. The chemical source is introduced as flood, time-varying, spatially varying, or continuous. In other embodiments, a mechanical source is derived from rotational, translational, compressional, expansional, or ultrasonic energies. The mechanical source can be introduced as flood, time-varying, spatially varying, or continuous. In further embodiments, the electrical source is selected from an applied voltage or an applied electro-magnetic field, which is introduced as flood, time-varying, spatially varying, or continuous. In still further embodiments, the thermal source or sink is selected from radiation, convection, or conduction. This thermal source can be selected from, among others, a photon beam, a fluid jet, a liquid jet, a gas jet, an electro/magnetic field, an electron beam, a thermo-electric heating, a furnace, and the like. The thermal sink can be selected from a fluid jet, a liquid jet, a gas jet, a cryogenic fluid, a super-cooled liquid, a thermo-electric cooling means, an electro/magnetic field, and others. Similar to the previous embodiments, the thermal source is applied as flood, time-varying, spatially varying, or continuous. Still further, any of the above embodiments can be combined or even separated, depending upon the application. Of course, the type of source used depends upon the application.

Figure 18:
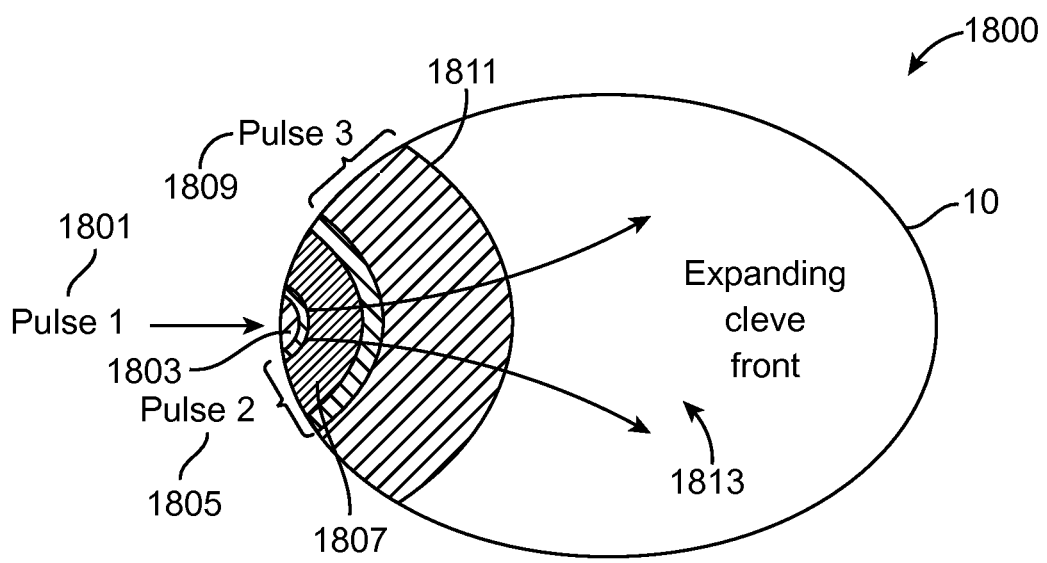

In a specific embodiment, a controlled-propagating cleave is provided. The controlled-propagating cleave uses multiple successive impulses to initiate and perhaps propagate a cleaving process 1800, as illustrated by FIG. 18. This diagram is merely an illustration, and should not limit the scope of the claims herein. As shown, the impulse is directed at an edge of the substrate, which propagates a cleave front toward the center of the substrate to remove the material layer from the substrate. In this embodiment, a source applies multiple pulses (i.e., pulse 1, 2, and 3) successively to the substrate. Pulse 1 1801 is directed to an edge 1803 of the substrate to initiate the cleave action. Pulse 2 1805 is also directed at the edge 1807 on one side of pulse 1 to expand the cleave front. Pulse 3 1809 is directed to an opposite edge 1811 of pulse 1 along the expanding cleave front to further remove the material layer from the substrate. The combination of these impulses or pulses provides a controlled cleaving action 1813 of the material layer from the substrate.

Figure 19:
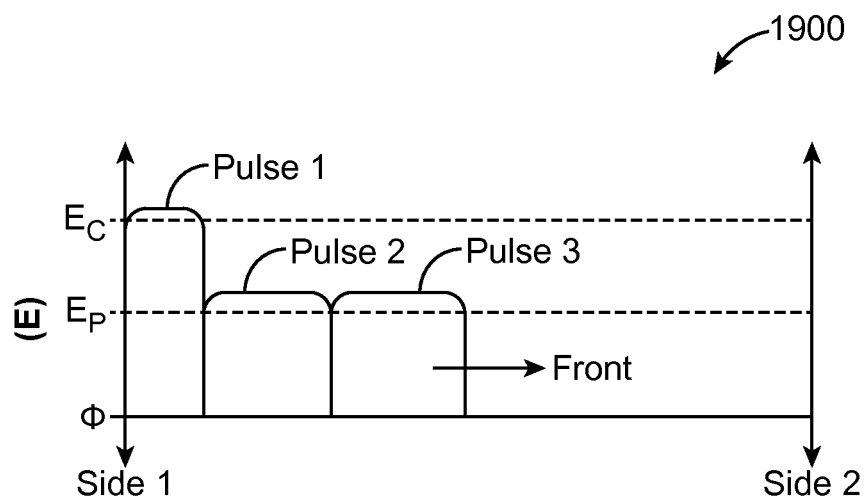

FIG. 19 is a simplified illustration of selected energies 1900 from the pulses in the preceding embodiment for the controlled-propagating cleave. This diagram is merely an illustration, and should not limit the scope of the claims herein. As shown, the pulse 1 has an energy level which exceeds average cleaving energy (E), which is the necessary energy for initiating the cleaving action. Pulses 2 and 3 are made using lower energy levels along the cleave front to maintain or sustain the cleaving action. In a specific embodiment, the pulse is a laser pulse where an impinging beam heats a selected region of the substrate through a pulse and a thermal pulse gradient causes supplemental stresses which together exceed cleave formation or propagation energies, which create a single cleave front. In preferred embodiments, the impinging beam heats and causes a thermal pulse gradient simultaneously, which exceeds cleave energy formation or propagation energies. More preferably, the impinging beam cools and causes a thermal pulse gradient simultaneously, which exceeds cleave energy formation or propagation energies.

Optionally, a built-in energy state of the substrate or stress can be globally raised toward the energy level necessary to initiate the cleaving action, but not enough to initiate the cleaving action before directing the multiple successive impulses to the substrate according to the present invention.

The global energy state of the substrate can be raised or lowered using a variety of sources such as chemical, mechanical, thermal (sink or source), or electrical, alone or in combination. The chemical source can include a variety such as particles, fluids, gases, or liquids. These sources can also include chemical reaction to increase stress in the material region. The chemical source is introduced as flood, time-varying, spatially varying, or continuous. In other embodiments, a mechanical source is derived from rotational, translational, compressional, expansional, or ultrasonic energies. The mechanical source can be introduced as flood, time-varying, spatially varying, or continuous. In further embodiments, the electrical source is selected from an applied voltage or an applied electro-magnetic field, which is introduced as flood, time-varying, spatially varying, or continuous. In still further embodiments, the thermal source or sink is selected from radiation, convection, or conduction. This thermal source can be selected from, among others, a photon beam, a fluid jet, a liquid jet, a gas jet, an electro/magnetic field, an electron beam, a thermo-electric heating, and a furnace. The thermal sink can be selected from a fluid jet, a liquid jet, a gas jet, a cryogenic fluid, a super-cooled liquid, a thermo-electric cooling means, an electro/magnetic field, and others. Similar to the previous embodiments, the thermal source is applied as flood, time-varying, spatially varying, or continuous. Still further, any of the above embodiments can be combined or even separated, depending upon the application. Of course, the type of source used also depends upon the application. As noted, the global source increases a level of energy or stress in the material region without initiating a cleaving action in the material region before providing energy to initiate the controlled cleaving action.

In a specific embodiment, an energy source elevates an energy level of the substrate cleave plane above its cleave front propagation energy but is insufficient to cause self-initiation of a cleave front. In particular, a thermal energy source or sink in the form of heat or lack of heat (e.g., cooling source) can be applied globally to the substrate to increase the energy state or stress level of the substrate without initiating a cleave front. Alternatively, the energy source can be electrical, chemical, or mechanical. A directed energy source provides an application of energy to a selected region of the substrate material to initiate a cleave front which self-propagates through the implanted region of the substrate until the thin film of material is removed. A variety of techniques can be used to initiate the cleave action. These techniques are described by way of the Figs. below.

Figure 20:
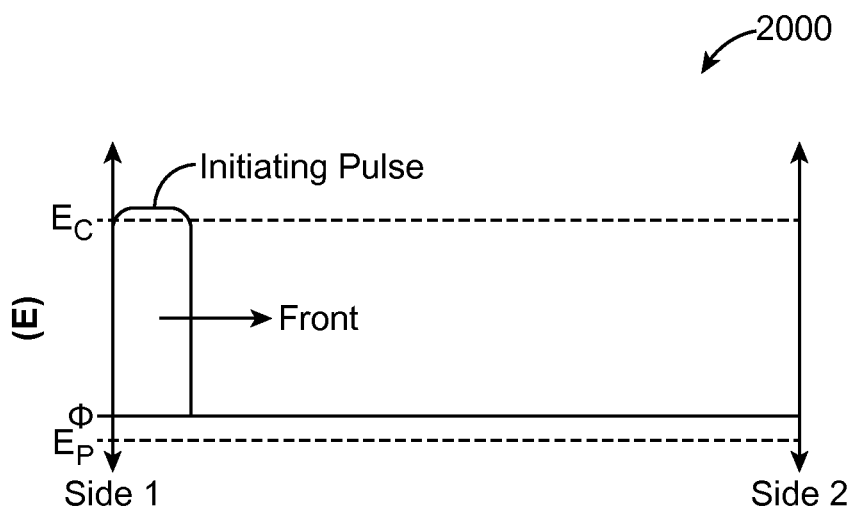

FIG. 20 is a simplified illustration of an energy state 2000 for a controlled cleaving action using a single controlled source according to an aspect of the present invention. This diagram is merely an illustration, and should not limit the scope of the claims herein. In this embodiment, the energy level or state of the substrate is raised using a global energy source above the cleave front propagation energy state, but is lower than the energy state necessary to initiate the cleave front. To initiate the cleave front, an energy source such as a laser directs a beam in the form of a pulse at an edge of the substrate to initiate the cleaving action. Alternatively, the energy source can be a cooling fluid (e.g., liquid, gas) that directs a cooling medium in the form of a pulse at an edge of the substrate to initiate the cleaving action. The global energy source maintains the cleaving action which generally requires a lower energy level than the initiation energy.

Figure 21:
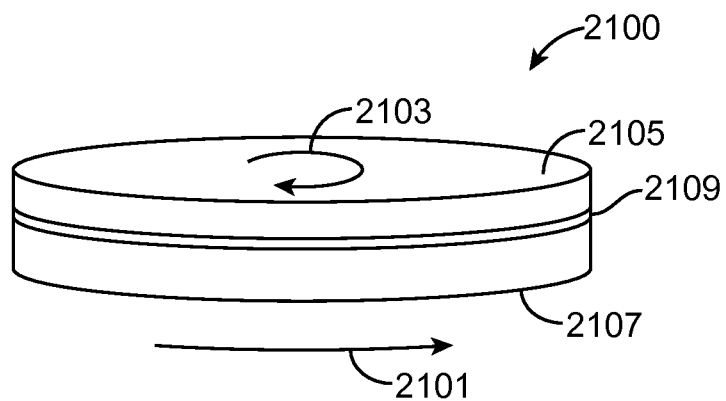
Figure 22:
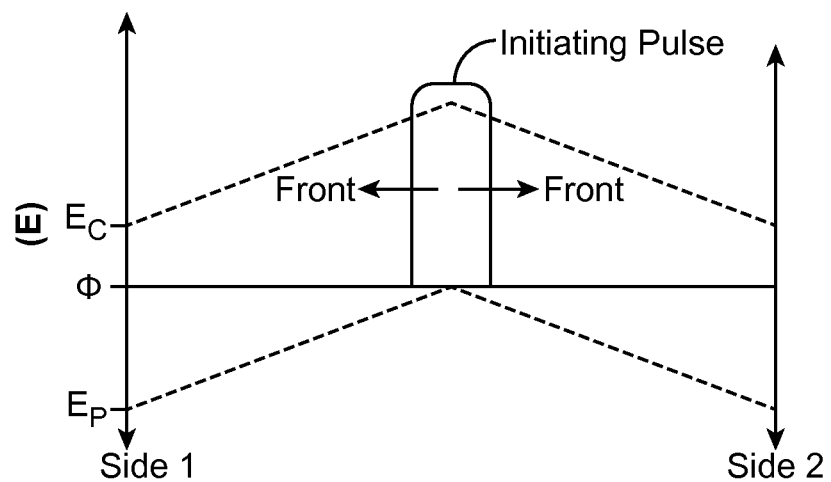

An alternative aspect of the invention is illustrated by FIGS. 21 and 22. FIG. 21 is a simplified illustration of an implanted substrate 2100 undergoing rotational forces 2101, 2103. This diagram is merely an illustration, and should not limit the scope of the claims herein. As shown, the substrate includes a top surface 2105, a bottom surface 2107, and an implanted region 2109 at a selected depth. An energy source increases a global energy level of the substrate using a light beam or heat source to a level above the cleave front propagation energy state, but lower than the energy state necessary to initiate the cleave front. The substrate undergoes a rotational force turning clockwise 2101 on top surface and a rotational force turning counter-clockwise 2103 on the bottom surface which creates stress at the implanted region 2109 to initiate a cleave front. Alternatively, the top surface undergoes a counter-clockwise rotational force and the bottom surface undergoes a clockwise rotational force. Of course, the direction of the force generally does not matter in this embodiment.

FIG. 22 is a simplified diagram of an energy state for the controlled cleaving action using the rotational force according to the present invention. This diagram is merely an illustration, and should not limit the scope of the claims herein. As previously noted, the energy level or state of the substrate is raised using a global energy source (e.g., thermal, beam) above the cleave front propagation energy state, but is lower than the energy state necessary to initiate the cleave front. To initiate the cleave front, a mechanical energy means such as rotational force applied to the implanted region initiates the cleave front. In particular, rotational force applied to the implanted region of the substrates creates zero stress at the center of the substrate and greatest at the periphery, essentially being proportional to the radius. In this example, the central initiating pulse causes a radially expanding cleave front to cleave the substrate.

The removed material region provides a thin film of silicon material for processing. The silicon material possesses limited surface roughness and desired planarity characteristics for use in a silicon-on-insulator substrate. In certain embodiments, the surface roughness of the detached film has features that are less than about 60 nm, or less than about 40 nm, or less than about 20 nm. Accordingly, the present invention provides thin silicon films which can be smoother and more uniform than pre-existing techniques.

Figure 23A:
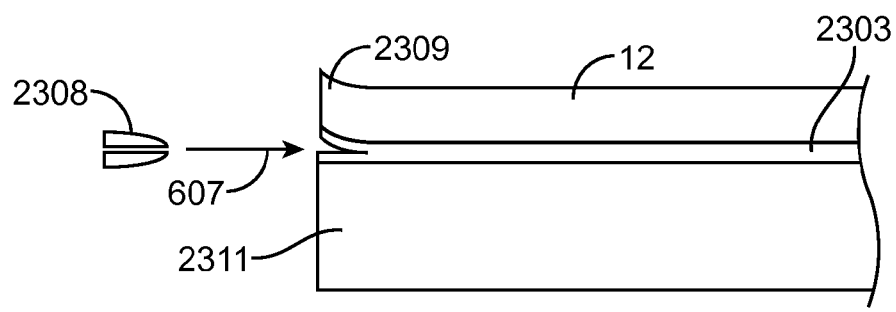
FIG. 23A is a simplified diagram illustrating a controlled cleaving technique using dynamic pressure embodied as a high-pressure jet of fluid or gas to separate a thin film of material from a donor wafer.

In a specific embodiment, the energy source can be a fluid jet that is pressurized (e.g., compressional) according to an embodiment of the present invention. FIG. 23A shows a simplified cross-sectional view diagram of a fluid jet from a fluid nozzle 2308 used to perform the controlled cleaving process according to an embodiment of the present invention. The fluid jet 2307 (or liquid jet or gas jet) impinges on an edge region of substrate 10 to initiate the controlled cleaving process. The fluid jet from a compressed or pressurized fluid source is directed to a region at the selected depth 2303 to cleave a thickness of material region 12 from substrate 10 using force, e.g., mechanical, chemical, thermal. As shown, the fluid jet separates substrate 10 into two regions, including region 2309 and region 2311 that separate from each other at selected depth 2303. The fluid jet can also be adjusted to initiate and maintain the controlled cleaving process to separate material 12 from substrate 10. Depending upon the application, the fluid jet can be adjusted in direction, location, and magnitude to achieve the desired controlled cleaving process. The fluid jet can be a liquid jet or a gas jet or a combination of liquid and gas. The fluid jet can separate a thin film from the substrate at ambient (i.e., room) temperature, but the substrate and/or jet can also be heated or cooled to facilitate the separation process.

Figure 23B:
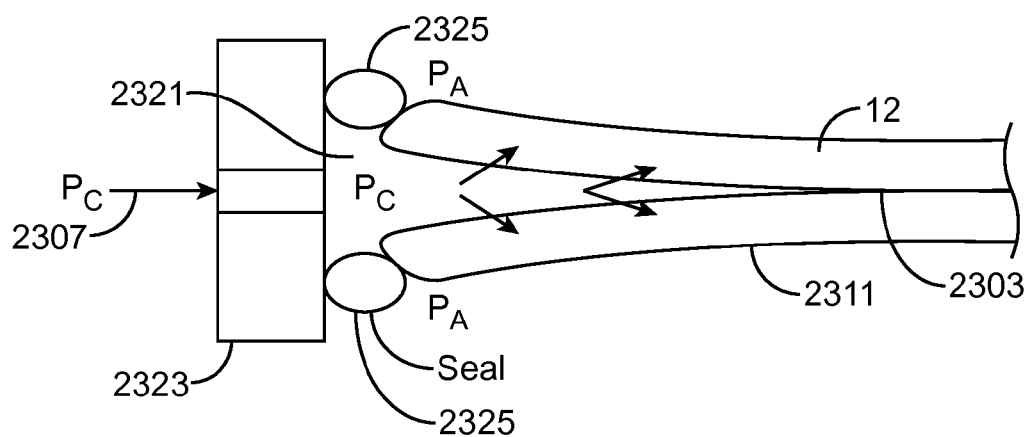
FIG. 23B is a simplified diagram illustrating a controlled cleaving technique using static pressure to separate a thin film of material from a donor wafer according to an embodiment.

In an embodiment, the energy source can be a compressional source such as, for example, compressed fluid that is static. FIG. 23B shows a simplified cross-sectional view diagram of a compressed fluid source 2307 according to an embodiment of the present invention. The compressed fluid source 2307 (e.g., pressurized liquid, pressurized gas) is applied to a sealed chamber 2321, which surrounds a periphery or edge of the substrate 10. As shown, the chamber is enclosed by device 2323, which is sealed by, for example, O-rings 2325 or the like, and which surrounds the outer edge of the substrate. The chamber has a pressure maintained at PC that is applied to the edge region of substrate 10 to initiate the controlled cleaving process at the selected depth of implanted material. The outer surface or face of the substrate is maintained at pressure PA which can be ambient pressure e.g., 1 atmosphere or less. A pressure differential exists between the pressure in the chamber, which is higher, and the ambient pressure. The pressure difference applies force to the implanted region at the selected depth 2303. The implanted region at the selected depth is structurally weaker than surrounding regions, including any bonded regions. Force is applied via the pressure differential until the controlled cleaving process is initiated. The controlled cleaving process separates the thickness of material 2309 from substrate material 2311 to split the thickness of material from the substrate material at the selected depth. Additionally, pressure PC forces material region 12 to separate by a "prying action" from substrate material 2311. During the cleaving process, the pressure in the chamber can also be adjusted to initiate and maintain the controlled cleaving process to separate material 12 from substrate 10. Depending upon the application, the pressure can be adjusted in magnitude to achieve the desired controlled cleaving process. The fluid pressure can be derived from a liquid or a gas or a combination of liquid and gas. Optionally, a mechanical force, as from a pin or blade, may be applied to the edge of the implanted region to initiate the cleaving process, which typically reduces the maximum pressure differential required between the chamber and the ambient.

Embodiments may be practiced at temperatures that are lower than those used by pre-existing techniques. In particular, embodiments do not require increasing the entire substrate temperature to initiate and sustain the cleaving action as pre-existing techniques. In some embodiments for silicon wafers and hydrogen implants, substrate temperature does not exceed about 400 C. during the cleaving process. Alternatively, substrate temperature does not exceed about 350 C. during the cleaving process. Alternatively, substrate temperature is kept substantially below implanting temperatures via a thermal sink, e.g., cooling fluid, cryogenic fluid. Accordingly, the present invention reduces a possibility of unnecessary damage from an excessive release of energy from random cleave fronts, which generally improves surface quality of a detached film(s) and/or the substrate(s). Accordingly, the present invention provides resulting films on substrates at higher overall yields and quality.

The above embodiments are described in terms of cleaving a thin film of material from a substrate. The substrate, however, can be disposed on a workpiece such as a stiffener or the like before the controlled cleaving process. The workpiece joins to a top surface or implanted surface of the substrate to provide structural support to the thin film of material during controlled cleaving processes. The workpiece can be joined to the substrate using a variety of bonding or joining techniques, e.g., electro-statics, adhesives, interatomic. Some of these bonding techniques are described herein. The workpiece can be made of a dielectric material (e.g., quartz, glass, sapphire, silicon nitride, silicon dioxide), a conductive material (silicon, silicon carbide, polysilicon, group III/V materials, metal), and plastics (e.g., polyimide-based materials). Of course, the type of workpiece used will depend upon the application.

Alternatively, the substrate having the film to be detached can be temporarily disposed on a transfer substrate such as a stiffener or the like before the controlled cleaving process. The transfer substrate joins to a top surface or implanted surface of the substrate having the film to provide structural support to the thin film of material during controlled cleaving processes. The transfer substrate can be temporarily joined to the substrate having the film using a variety of bonding or joining techniques, e.g., electro-statics, adhesives, interatomic. Some of these bonding techniques are described herein. The transfer substrate can be made of a dielectric material (e.g., quartz, glass, sapphire, silicon nitride, silicon dioxide), a conductive material (silicon, silicon carbide, polysilicon, group III/V materials, metal), and plastics (e.g., polyimide-based materials). Of course, the type of transfer substrate used will depend upon the application. Additionally, the transfer substrate can be used to remove the thin film of material from the cleaved substrate after the controlled cleaving process.

2. Silicon-On-Insulator Process

A process for fabricating a silicon-on-insulator substrate according to the present invention may be briefly outlined as follows:

(1) Provide a donor silicon wafer (which may be coated with a dielectric material);

(2) Introduce particles into the silicon wafer to a selected depth to define a thickness of silicon film;

(3) Provide a target substrate material (which may be coated with a dielectric material);

(4) Bond the donor silicon wafer to the target substrate material by joining the implanted face to the target substrate material;

(5) Increase global stress (or energy) of implanted region at selected depth without initiating a cleaving action (optional);

(6) Provide stress (or energy) to a selected region of the bonded substrates to initiate a controlled cleaving action at the selected depth;

(7) Provide additional energy to the bonded substrates to sustain the controlled cleaving action to free the thickness of silicon film from the silicon wafer (optional);

(8) Complete bonding of donor silicon wafer to the target substrate; and (9) Polish a surface of the thickness of silicon film.

The above sequence of steps provides a step of initiating a controlled cleaving action using an energy applied to a selected region(s) of a multi-layered substrate structure to form a cleave front(s) according to the present invention. This initiation step begins a cleaving process in a controlled manner by limiting the amount of energy applied to the substrate. Further propagation of the cleaving action can occur by providing additional energy to selected regions of the substrate to sustain the cleaving action, or using the energy from the initiation step to provide for further propagation of the cleaving action. This sequence of steps is merely an example and should not limit the scope of the claims defined herein. Further details with regard to the above sequence of steps described below.

Figure 24:
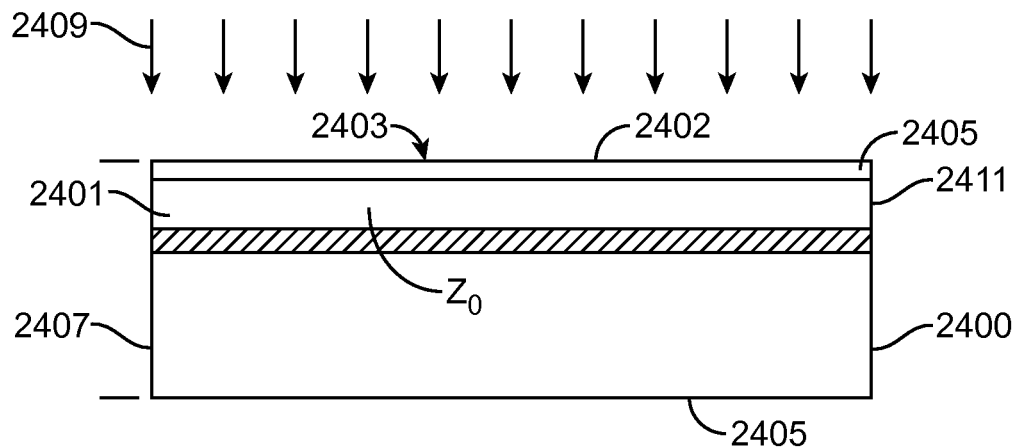
FIG. 24 is a simplified diagram illustrating the use of static fluid pressure to separate a thin film of material from a donor wafer.

FIGS. 24-29 are simplified cross-sectional view diagrams of substrates undergoing a fabrication process for a silicon-on-insulator wafer according to the present invention. The process begins by providing a semiconductor substrate similar to the silicon wafer 2400, as shown by FIG. 24. Substrate or donor includes a material region 2401 to be removed, which is a thin relatively uniform film derived from the substrate material. The silicon wafer includes a top surface 2403, a bottom surface 2405, and a thickness 2407. Material region also includes a thickness (z0), within the thickness 2407 of the silicon wafer. Optionally, a dielectric layer 2402 (e.g., silicon nitride, silicon oxide, silicon oxynitride) overlies the top surface of the substrate. The present process provides a novel technique for removing the material region 2401 using the following sequence of steps for the fabrication of a silicon-on-insulator wafer.

Selected energetic particles 2409 implant through the top surface of the silicon wafer to a selected depth, which defines the thickness of the material region, termed the thin film of material. As shown, the particles have a desired concentration 2411 at the selected depth (z0). A variety of techniques can be used to implant the energetic particles into the silicon wafer. These techniques include ion implantation using, for example, beam line ion implantation equipment manufactured from companies such as Applied Materials, Eaton Corporation, Varian, and others. Alternatively, implantation occurs using a plasma immersion ion implantation ("PIII") technique. Of course, techniques used depend upon the application.

Depending upon the application, smaller mass particles are generally selected to reduce a possibility of damage to the material region. That is, smaller mass particles easily travel through the substrate material to the selected depth without substantially damaging the material region that the particles traversed through. For example, the smaller mass particles (or energetic particles) can be almost any charged (e.g., positive or negative) and/or neutral atoms or molecules, or electrons, or the like. In a specific embodiment, the particles can be neutral and/or charged particles including ions of hydrogen and its isotopes, rare gas ions such as helium and its isotopes, and neon. The particles can also be derived from compounds such as gases, e.g., hydrogen gas, water vapor, methane, and other hydrogen compounds, and other light atomic mass particles. Alternatively, the particles can be any combination of the above particles, and/or ions and/or molecular species and/or atomic species.

Figure 25:
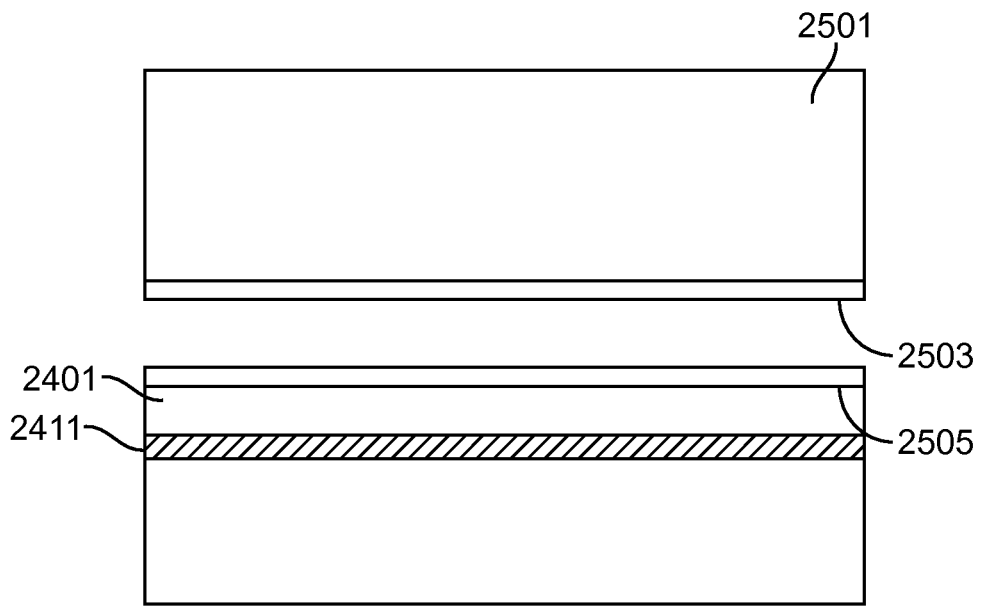
FIGS. 25-29 are simplified cross-sectional view diagrams illustrating a method of forming a silicon-on-insulator substrate.

The process uses a step of joining the implanted silicon wafer 2400 to a workpiece 2501 or target wafer, as illustrated in FIG. 25. The workpiece may also be a variety of other types of substrates such as those made of a dielectric material (e.g., quartz, glass, silicon nitride, silicon dioxide), a conductive material (silicon, polysilicon, group III/V materials, metal), and plastics (e.g., polyimide-based materials). In the present example, however, the workpiece is a silicon wafer.

In a specific embodiment, the silicon wafers are joined or fused together using a low temperature thermal step. The low temperature thermal process generally ensures that the implanted particles do not place excessive stress on the material region, which can produce an uncontrolled cleave action. In one aspect, the low temperature bonding process occurs by a self-bonding process. In particular, one wafer is stripped to remove oxidation therefrom (or one wafer is not oxidized). A cleaning solution treats the surface of the wafer to form O—H bonds on the wafer surface. An example of a solution used to clean the wafer is a mixture of H2O2—H2SO4. A dryer dries the wafer surfaces to remove any residual liquids or particles from the wafer surfaces. Self-bonding occurs by placing a face of the cleaned wafer against the face of an oxidized wafer.

Alternatively, a self-bonding process occurs by activating one of the wafer surfaces to be bonded by plasma cleaning. In particular, plasma cleaning activates the wafer surface using a plasma derived from gases such as argon, ammonia, neon, water vapor, nitrogen, and oxygen. The activated wafer surface 2503 is placed against a face of the other wafer, which has a coat of oxidation 2505 thereon. The wafers are in a sandwiched structure having exposed wafer faces. A selected amount of pressure is placed on each exposed face of the wafers to self-bond one wafer to the other.

Alternatively, an adhesive disposed on the wafer surfaces is used to bond one wafer onto the other. The adhesive includes an epoxy, polyimide-type materials, and the like. Spin-on-glass layers can be used to bond one wafer surface onto the face of another. These spin-on-glass ("SOG") materials include, among others, siloxanes or silicates, which are often mixed with alcohol-based solvents or the like. SOG can be a desirable material because of the low temperatures (e.g. 150 to 250 C.) often needed to cure the SOG after it is applied to surfaces of the wafers.

Alternatively, a variety of other low temperature techniques can be used to join the donor wafer to the target wafer. For instance, an electro-static bonding technique can be used to join the two wafers together. In particular, one or both wafer surface(s) is charged to attract to the other wafer surface. Additionally, the donor wafer can be fused to the target wafer using a variety of commonly known techniques. Of course, the technique used depends upon the application.

Figure 26:
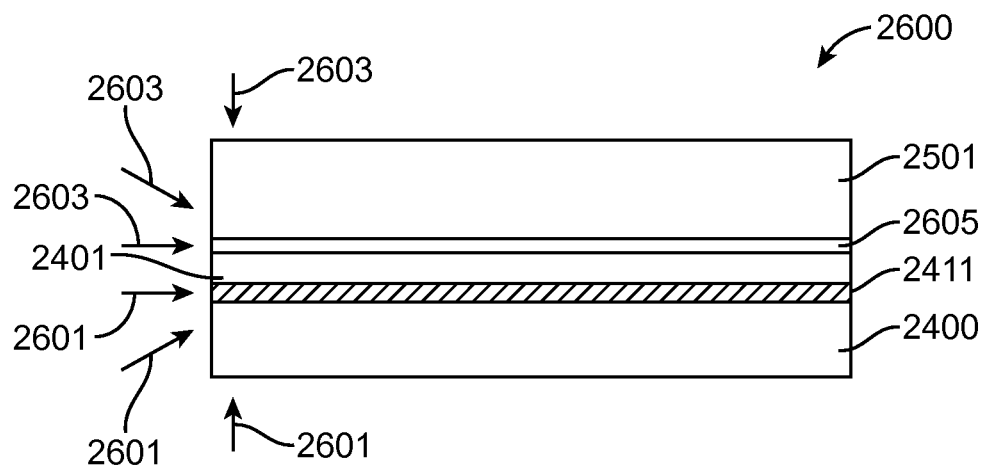

After bonding the wafers into a sandwiched structure 2600, as shown in FIG. 26, the method includes a controlled cleaving action to remove the substrate material to provide a thin film of substrate material 2401 overlying an insulator 2605 the target silicon wafer 2501. The controlled-cleaving occurs by way of selective energy placement or positioning or targeting 2601, 2603 of energy sources onto the donor and/or target wafers. For instance, an energy impulse(s) can be used to initiate the cleaving action. The impulse (or impulses) is provided using an energy source which include, among others, a mechanical source, a chemical source, a thermal sink or source, and an electrical source.

The controlled cleaving action is initiated by way of any of the previously noted techniques and others and is illustrated by way of FIG. 26. For instance, a process for initiating the controlled cleaving action uses a step of providing energy 2601, 2603 to a selected region of the substrate to initiate a controlled cleaving action at the selected depth (z0) in the substrate, whereupon the cleaving action is made using a propagating cleave front to free a portion of the substrate material to be removed from the substrate. In a specific embodiment, the method uses a single impulse to begin the cleaving action, as previously noted. Alternatively, the method uses an initiation impulse, which is followed by another impulse or successive impulses to selected regions of the substrate. Alternatively, the method provides an impulse to initiate a cleaving action which is sustained by a scanned energy along the substrate. Alternatively, energy can be scanned across selected regions of the substrate to initiate and/or sustain the controlled cleaving action.

Optionally, an energy or stress of the substrate material is increased toward an energy level necessary to initiate the cleaving action, but not enough to initiate the cleaving action before directing an impulse or multiple successive impulses to the substrate according to the present invention. The global energy state of the substrate can be raised or lowered using a variety of sources such as chemical, mechanical, thermal (sink or source), or electrical, alone or in combination. The chemical source can include particles, fluids, gases, or liquids. These sources can also include chemical reaction to increase stress in the material region. The chemical source is introduced as flood, time-varying, spatially varying, or continuous. In other embodiments, a mechanical source is derived from rotational, translational, compressional, expansional, or ultrasonic energies. The mechanical source can be introduced as flood, time-varying, spatially varying, or continuous. In further embodiments, the electrical source is selected from an applied voltage or an applied electro-magnetic field, which is introduced as flood, time-varying, spatially varying, or continuous. In still further embodiments, the thermal source or sink is selected from radiation, convection, or conduction. This thermal source can be selected from, among others, a photon beam, a fluid jet, a liquid jet, a gas jet, an electro/magnetic field, an electron beam, a thermo-electric heating, and a furnace. The thermal sink can be selected from a fluid jet, a liquid jet, a gas jet, a cryogenic fluid, a supercooled liquid, a thermo-electric cooling means, an electro/magnetic field, and others. Similar to the previous embodiments, the thermal source is applied as flood, time varying, spatially varying, or continuous. Still further, any of the above embodiments can be combined or even separated, depending upon the application. Of course, the type of source used depends upon the application. As noted, the global source increases a level of energy or stress in the material region without initiating a cleaving action in the material region before providing energy to initiate the controlled cleaving action.

In a preferred embodiment, the method maintains a temperature which is below a temperature of introducing the particles into the substrate. In some embodiments, the substrate temperature is maintained between −200 and 450° C. during the step of introducing energy to initiate propagation of the cleaving action. Substrate temperature can also be maintained at a temperature below 400° C. In preferred embodiments, the method uses a thermal sink to initiate and maintain the cleaving action, which occurs at conditions significantly below room temperature.

Figure 27:
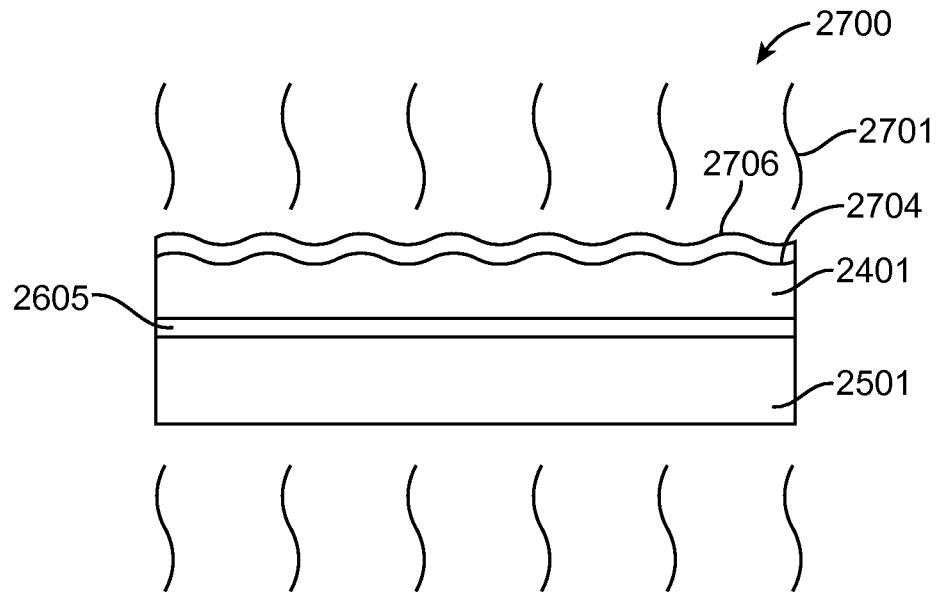

A final bonding step occurs between the target wafer 2501 and thin film of material region 2501 according to some embodiments, as illustrated by FIG. 27. In one embodiment, one silicon wafer 2400 has an overlying layer of silicon dioxide 2505, which is thermally grown overlying the face before cleaving the thin film of material, as shown in FIG. 25. The silicon dioxide 2505 can also be formed using a variety of other techniques, e.g., chemical vapor deposition. The silicon dioxide 2505 between the wafer surfaces fuses together thermally in this process.

In some embodiments, the oxidized silicon surface from either the target wafer or the thin film of material region (from the donor wafer) are further pressed together and are subjected to an oxidizing ambient 2701. The oxidizing ambient can be in a diffusion furnace for steam oxidation, hydrogen oxidation, or the like. A combination of the pressure and the oxidizing ambient fuses the thin film of silicon material 2401 to the target silicon wafer 2501 together at the oxide surface or interface 2605. These embodiments often require high temperatures (e.g., 700 C.).

Alternatively, the two silicon surfaces are further pressed together and subjected to an applied voltage between the two wafers. The applied voltage raises temperature of the wafers to induce a bonding between the wafers. This technique limits the amount of crystal defects introduced into the silicon wafers during the bonding process, since substantially no significant mechanical force is needed to initiate the bonding action between the wafers. Of course, the technique used depends upon the application.

After bonding the wafers, silicon-on-insulator has a target substrate 2501 with an overlying film of silicon material 2401 and a sandwiched oxide layer 2505 between the target substrate 2501 and the silicon wafer 2400, as also illustrated in FIG. 25. The detached surface of the film of silicon material is often rough 2704 and needs finishing. Finishing occurs using a combination of grinding and/or polishing techniques. In some embodiments, the detached surface undergoes a step of grinding using, for examples, techniques such as rotating an abrasive material overlying the detached surface to remove any imperfections or surface roughness therefrom. A machine such as a "back grinder" made by a company called Disco may provide this technique.

Figure 28:
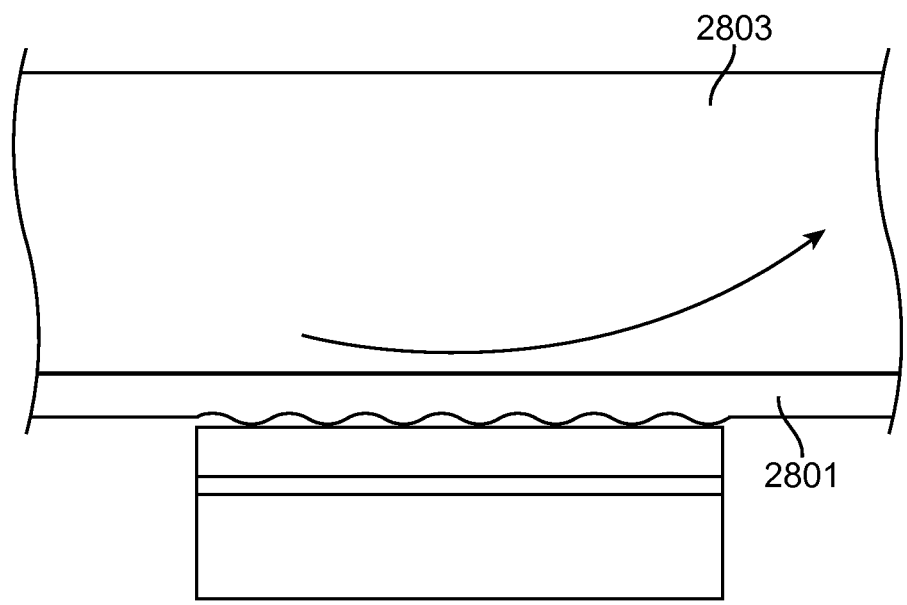

Alternatively, chemical mechanical polishing or planarization ("CMP") techniques finish the detached surface of the film, as illustrated by FIG. 28. In CMP, a slurry mixture is applied directly to a polishing surface 2801 which is attached to a rotating platen 2803. This slurry mixture can be transferred to the polishing surface by way of an orifice, which is coupled to a slurry source. The slurry is often a solution containing an abrasive and an oxidizer, e.g., H2O2, KIO3, ferric nitrate. The abrasive is often a borosilicate glass, titanium dioxide, titanium nitride, aluminum oxide, aluminum trioxide, iron nitrate, cerium oxide, silicon dioxide (colloidal silica), silicon nitride, silicon carbide, graphite, diamond, and any mixtures thereof. This abrasive is mixed in a solution of deionized water and oxidizer or the like. Preferably, the solution is acidic.

Figure 29:
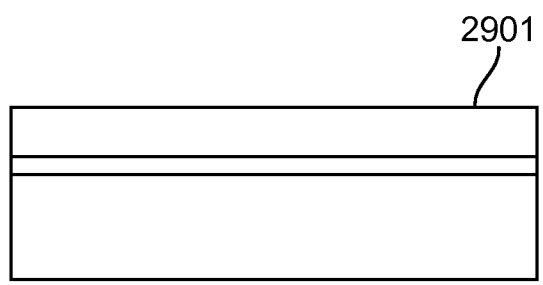

This acid solution generally interacts with the silicon material from the wafer during the polishing process. The polishing process preferably uses a poly-urethane polishing pad. An example of this polishing pad is one made by Rodel and sold under the trade name of IC-1000. The polishing pad is rotated at a selected speed. A carrier head which picks up the target wafer having the film applies a selected amount of pressure on the backside of the target wafer such that a selected force is applied to the film. The polishing process removes about a selected amount of film material, which provides a relatively smooth film surface 2901 for subsequent processing, as illustrated by FIG. 29.

In certain embodiments, a thin film of oxide 2706 overlies the film of material overlying the target wafer, as illustrated in FIG. 27. The oxide layer forms during the thermal annealing step, which is described above for permanently bonding the film of material to the target wafer. In these embodiments, the finishing process is selectively adjusted to first remove oxide and the film is subsequently polished to complete the process. Of course, the sequence of steps depends upon the particular application.

Although the above description is in terms of a silicon wafer, other substrates may also be used. For example, the substrate can be almost any monocrystalline, polycrystalline, or even amorphous type substrate. Additionally, the substrate can be made of III/V materials such as gallium arsenide, gallium nitride (GaN), and others. The multi-layered substrate can also be used according to the present invention. The multi-layered substrate includes a silicon-on-insulator substrate, a variety of sandwiched layers on a semiconductor substrate, and numerous other types of substrates. Additionally, the embodiments above were generally in terms of providing a pulse of energy to initiate a controlled cleaving action. The pulse can be replaced by energy that is scanned across a selected region of the substrate to initiate the controlled cleaving action. Energy can also be scanned across selected regions of the substrate to sustain or maintain the controlled cleaving action. One of ordinary skill in the art would easily recognize a variety of alternatives, modifications, and variations, which can be used according to the present invention.

Another embodiment of the present invention provides a method that includes providing a semiconductor workpiece including a surface region, introducing a plurality of particles through the surface region to form a cleave region in the semiconductor workpiece, applying energy to cleave a detached thickness of semiconductor material from a remainder of the semiconductor workpiece, and bonding the detached thickness of semiconductor material to a substrate having a coefficient of thermal expansion approximately equal to a coefficient of thermal expansion of the layer of additional material.

In an embodiment of the above method, providing the semiconductor workpiece comprises providing a single crystal silicon workpiece.

In an embodiment, providing the single crystal silicon workpiece comprises providing a (111) single crystal silicon workpiece.

In another embodiment, the bonding comprises releasable bonding between the additional layer of material and the substrate.

In another embodiment, the releasable bonding is based upon a surface roughness of the detached thickness of semiconductor material and/or a surface roughness of the substrate.

In another embodiment, the releasable bonding is based upon a sacrificial material present between a detached thickness of semiconductor material and the substrate.

In another embodiment, the detached thickness of semiconductor material is between about 10-100 um.

In another embodiment, the substrate comprises a metal substrate.

In another embodiment, providing the semiconductor workpiece comprises providing a GaN workpiece having the additional layer comprising a light-absorbing material.

According to another embodiment, method is provided that includes providing a semiconductor workpiece comprising (111) single crystal silicon, forming GaN on the semiconductor workpiece, and bonding to the GaN, a substrate having a matched coefficient of thermal expansion.

In an embodiment of the above method, forming the GaN comprises forming a layer of GaN having a critical thickness indicated in FIG. 1 of Jothilingam et al., "A Study of Cracking in GaN Grown on Silicon by Molecular Beam Epitaxy", Journal of Electronic Materials, Vol. 30, No. 7, pp. 821-824 (2001).

In another embodiment, providing the semiconductor workpiece comprises providing a bulk ingot, and the method further comprises detaching a layer of the semiconductor workpiece bearing the GaN by controlled cleaving.

In another embodiment, the controlled cleaving comprises cleaving along a cleave region formed by implantation of particles through the GaN into the semiconductor workpiece.

In another embodiment, providing the semiconductor workpiece comprises providing a wafer separated from a bulk ingot by sawing.

In another embodiment, the method also includes relaxing a stress in the GaN.

In an embodiment, relaxing the stress comprises removing at least a portion of the semiconductor workpiece.

In another embodiment of the method, the substrate comprises Molybdenum.

While the above is a full description of the specific embodiments, various modifications, alternative constructions and equivalents may be used. Although the above has been described using a selected sequence of steps, any combination of any elements of steps described as well as others may be used. Additionally, certain steps may be combined and/or eliminated depending upon the embodiment. Furthermore, the particles of hydrogen can be replaced using co-implantation of helium and hydrogen ions or deuterium and hydrogen ions to allow for formation of the cleave plane with a modified dose and/or cleaving properties according to alternative embodiments. Still further, the particles can be introduced by a diffusion process rather than an implantation process. Of course there can be other variations, modifications, and alternatives. Therefore, the above description and illustrations should not be taken as limiting the scope of the present invention which is defined by the appended claims.

What is claimed is:

1. A method comprising:
   providing a workpiece bearing a layer of additional material;
   introducing a plurality of particles through the layer of additional material to form a cleave region in the workpiece;
   applying energy to cleave a detached thickness of workpiece material including the layer of additional material, from a remainder of the workpiece, and forming a free standing intermediate structure that includes only the detached workpiece material and the layer of additional material;
   processing the layer of additional material of the intermediate structure; and
   bonding the processed layer of additional material to a substrate having a coefficient of thermal expansion approximately equal to a coefficient of thermal expansion of the layer of additional material,
   wherein mismatch between the layer of additional material and the workpiece material develops a level of stress lower than a threshold value sufficient to nucleate and propagate defects within the layer of additional material.

2. The method as in claim 1 wherein the layer of additional material is formed on top of the workpiece at a temperature.

3. The method as in claim 1 wherein processing the layer of additional material comprises relaxing a level of stress in the layer of additional material.

4. The method as in claim 3 wherein relaxing the level of stress comprises removing the workpiece material.

5. The method as in claim 4 wherein removing the workpiece material comprises etching the workpiece material.

6. The method as in claim 3 wherein relaxing the level of stress comprises bonding the layer of additional material to a strain relaxation substrate (SRS), and then changing a property of the SRS.

7. The method as in claim 6 wherein the SRS comprises a piezoelectric material, and changing the property comprises changing a dimension of the piezoelectric material.

8. The method as in claim 6 wherein the SRS comprises a surface bonded to the layer of additional material, and changing the property comprises changing the surface from solidus to liquidus.

9. The method as in claim 1 wherein providing the workpiece comprises providing a single crystal silicon workpiece bearing GaN as the layer of additional material.

10. The method as in claim 9 wherein providing the single crystal silicon workpiece comprises providing a (111) single crystal silicon workpiece.

11. The method as in claim 10 wherein the layer of GaN comprises a layer of thickness between about 0.1-1 um formed by a low temperature epitaxial growth process at a temperature of between about 700-900° C.

12. The method as in claim 1 wherein the bonding comprises releasable bonding between the layer of additional material and the substrate.

13. The method as in claim 12 wherein the releasable bonding is based upon surface roughness of the layer of additional material and/or surface roughness of the substrate.

14. The method as in claim 1 wherein the detached thickness of workpiece material is between about 10-100 um.

15. The method as in claim 1 wherein providing the workpiece comprises providing a silicon or sapphire workpiece bearing GaN as the layer of additional material.

16. A method comprising:
providing a workpiece bearing a layer of additional material at an interface;
directing a plurality of accelerated particles at the layer of additional material to form a cleave region at or near the interface;
applying energy to cleave a detached thickness of workpiece material including the layer of additional material, from a remainder of the workpiece, and forming a free standing intermediate structure that includes only the detached workpiece material and the layer of additional material;
processing the layer of additional material of the intermediate structure; and
bonding the layer of additional material to a substrate having a coefficient of thermal expansion approximately equal to a coefficient of thermal expansion of the layer of additional material,
wherein mismatch between the layer of additional material and the workpiece material develops a level of stress lower than a threshold value sufficient to nucleate and propagate defects within the layer of additional material.

17. The method as in claim 16 wherein the layer of additional material is formed on top of the workpiece at a temperature.

18. The method as in claim 17 wherein processing the layer of additional material comprises relaxing a level of stress in the layer of additional material.

19. The method as in claim 18 wherein relaxing the level of stress comprises removing workpiece material.

20. The method as in claim 19 wherein removing the workpiece material comprises etching.

21. The method as in claim 18 wherein relaxing the level of stress comprises bonding the layer of additional material to a strain relaxation substrate (SRS), and then changing a property of the SRS.

22. The method as in claim 21 wherein the SRS comprises a piezoelectric material, and changing the property comprises changing a dimension of the piezoelectric material.

23. The method as in claim 21 wherein the SRS comprises a surface bonded to the layer of additional material, and changing the property comprises changing the surface from solidus to liquidus.

24. The method as in claim 16 wherein providing the workpiece comprises providing a single crystal silicon workpiece bearing GaN as the layer of additional material.

25. The method as in claim 24 wherein providing the single crystal silicon workpiece comprises providing a (111) single crystal silicon workpiece.

26. The method as in claim 24 wherein the layer of GaN comprises a layer of thickness between about 0.1-1 um formed by a low-temperature epitaxial growth process at a temperature of about 700-900° C.

27. The method as in claim 16 wherein the bonding comprises releasable bonding between the layer of additional material and the substrate.

28. The method as in claim 27 wherein the releasable bonding is based upon surface roughness of the layer of additional material and/or surface roughness of the substrate.

29. The method as in claim 16 wherein the detached thickness of workpiece material is between about 10-100 um.

30. The method as in claim 16 wherein providing the workpiece comprises providing a silicon or sapphire workpiece bearing GaN as the layer of additional material.

* * * * *